US010878912B1

(12) United States Patent
Ismail et al.

(10) Patent No.: US 10,878,912 B1
(45) Date of Patent: Dec. 29, 2020

(54) MULTI-CELL MODULATION FOR FLASH MEMORY

(71) Applicants: Kabushiki Kaisha Toshiba, Minato-ku (JP); Toshiba Memory Corporation, Minato-ku (JP)

(72) Inventors: Amr Ismail, Bristol (GB); Magnus Stig Torsten Sandell, Bristol (GB)

(73) Assignees: Kabushiki Kaisha Toshiba, Minato-ku (JP); Toshiba Memory Corporation, Minato-ku (JP)

(*) Notice: Subject to any disclaimer, the term of this patent is extended or adjusted under 35 U.S.C. 154(b) by 0 days.

(21) Appl. No.: 16/530,252

(22) Filed: Aug. 2, 2019

(51) Int. Cl.
*G11C 16/16* (2006.01)
*G11C 16/10* (2006.01)
*G11C 11/56* (2006.01)
*G11C 16/04* (2006.01)

(52) U.S. Cl.
CPC .......... *G11C 16/10* (2013.01); *G11C 11/5628* (2013.01); *G11C 16/0483* (2013.01); *G11C 16/16* (2013.01)

(58) Field of Classification Search
CPC ............................ G06F 12/0246; G11C 16/16
USPC .............................................. 365/145, 185.33
See application file for complete search history.

(56) References Cited

U.S. PATENT DOCUMENTS

| 6,469,931 | B1 | 10/2002 | Ban et al. |
| 7,397,686 | B2* | 7/2008 | Takashima .......... G06F 12/0246 365/145 |
| 8,055,972 | B2 | 11/2011 | Lasser |
| 9,411,679 | B2 | 8/2016 | Seol et al. |
| 2011/0093652 | A1 | 4/2011 | Sharon et al. |
| 2011/0149657 | A1 | 6/2011 | Haratsch et al. |

OTHER PUBLICATIONS

R. Bez, E. Camerlenghi, A. Modelli and A. Visconti, "Introduction to flash memory," In Proceedings of the IEEE. vol. 91, No. 4, pp. 489-502, Apr. 2003, doi: 10.1109/JPROC.2003.811702.

(Continued)

*Primary Examiner* — Jason Lappas
(74) *Attorney, Agent, or Firm* — Oblon, McClelland, Maier & Neustadt, L.L.P.

(57) ABSTRACT

A method of storing a number of data values in a plurality of flash memory cells wherein each flash memory cell has a plurality of storage states and each data value is selected from a set of possible data values. The method comprises programming the number of data values to the plurality of flash memory cells using a mapping which uniquely associates each combination of storage states for the plurality of flash memory cells with a concatenated data value from a set of concatenated data values wherein the set of concatenated data values comprises a concatenated data value for every combination of possible data values for the number of data values, the concatenated data value has a position for each data value in the number of data values and the mapping is such that between adjacent storage states all but one data values are identical and each position in the concatenated data value changes the data value it represents between the same storage states on each flash memory cell.

19 Claims, 31 Drawing Sheets

(56) References Cited

OTHER PUBLICATIONS

E. Sharon and I. Alrod. "Coding scheme for optimizing random I/O performance," in Non-Volatile Memories Workshop, San Diego, CA, USA, Mar. 3-5, 2013 (Presentation & Abstract enclosed).
R. Rivest and A. Shamir, "How to reuse a 'write-once' memory," Information and Control 55, 1-19, 1982.
G. S. Bhat, "Balanced Gray codes," The Electronic Journal of Combinatorics, vol. 3, Issue 1 (1996).
G. Dong. N. Xie and T. Zhang, "Enabling NAND Flash Memory Use Soft-Decision Error Correction Codes at Minimal Read Latency Overhead," in IEEE Transactions on Circuits and Systems I: Regular Papers, vol. 60, No. 9, pp. 2412-2421, Sep. 2013, doi: 10.1109/TCSI.2013.2244361.

\* cited by examiner

| $M_2 \backslash M_1$ | 0 | 1 | 2 | 3 | 4 | 5 | 6 | 7 |
|---|---|---|---|---|---|---|---|---|
| 0 | $(v_e, v_e)$ | $(v_1, v_e)$ | $(v_e, v_1)$ | $(v_1, v_1)$ | $(v_e, v_5)$ | $(v_1, v_5)$ | $(v_e, v_4)$ | $(v_1, v_4)$ |
| 1 | $(v_3, v_e)$ | $(v_2, v_e)$ | $(v_3, v_1)$ | $(v_2, v_1)$ | $(v_3, v_5)$ | $(v_2, v_5)$ | $(v_3, v_4)$ | $(v_2, v_4)$ |
| 2 | $(v_7, v_e)$ | $(v_6, v_e)$ | $(v_7, v_1)$ | $(v_6, v_1)$ | $(v_7, v_5)$ | $(v_6, v_5)$ | $(v_7, v_4)$ | $(v_6, v_4)$ |
| 3 | $(v_4, v_e)$ | $(v_5, v_e)$ | $(v_4, v_1)$ | $(v_5, v_1)$ | $(v_4, v_5)$ | $(v_5, v_5)$ | $(v_4, v_4)$ | $(v_5, v_4)$ |
| 4 | $(v_e, v_7)$ | $(v_1, v_7)$ | $(v_e, v_2)$ | $(v_1, v_2)$ | $(v_e, v_6)$ | $(v_1, v_6)$ | $(v_e, v_3)$ | $(v_1, v_3)$ |
| 5 | $(v_3, v_7)$ | $(v_2, v_7)$ | $(v_3, v_2)$ | $(v_2, v_2)$ | $(v_3, v_6)$ | $(v_2, v_6)$ | $(v_3, v_3)$ | $(v_2, v_3)$ |
| 6 | $(v_7, v_7)$ | $(v_6, v_7)$ | $(v_7, v_2)$ | $(v_6, v_2)$ | $(v_7, v_6)$ | $(v_6, v_6)$ | $(v_7, v_3)$ | $(v_6, v_3)$ |
| 7 | $(v_4, v_7)$ | $(v_5, v_7)$ | $(v_4, v_2)$ | $(v_5, v_2)$ | $(v_4, v_6)$ | $(v_5, v_6)$ | $(v_4, v_3)$ | $(v_5, v_3)$ |

FIG. 9

| cell$_{2i}$ / cell$_{2i-1}$ | $v_e$ | $v_1$ | $v_2$ | $v_3$ | $v_4$ | $v_5$ | $v_6$ | $v_7$ | $v_8$ | $v_9$ | $v_{10}$ | $v_{11}$ | $v_{12}$ | $v_{13}$ | $v_{14}$ | $v_{15}$ |
|---|---|---|---|---|---|---|---|---|---|---|---|---|---|---|---|---|
| $v_e$ | 0,0 | 0,4 | 4,4 | 4,12 | 0,12 | 0,8 | 4,8 | 4,0 | 12,0 | 12,4 | 8,4 | 8,12 | 12,12 | 12,8 | 8,8 | 8,0 |
| $v_1$ | 0,1 | 0,5 | 4,5 | 4,13 | 0,13 | 0,9 | 4,9 | 4,1 | 12,1 | 12,5 | 8,5 | 8,13 | 12,13 | 12,9 | 8,9 | 8,1 |
| $v_2$ | 1,1 | 1,5 | 5,5 | 5,13 | 1,13 | 1,9 | 5,9 | 5,1 | 13,1 | 13,5 | 9,5 | 9,13 | 13,13 | 13,9 | 9,9 | 9,1 |
| $v_3$ | 1,3 | 1,7 | 5,7 | 5,15 | 1,15 | 1,11 | 5,11 | 5,3 | 13,3 | 13,7 | 9,7 | 9,15 | 13,15 | 13,11 | 9,11 | 9,3 |
| $v_4$ | 0,3 | 0,7 | 4,7 | 4,15 | 0,15 | 0,11 | 4,11 | 4,3 | 12,3 | 12,7 | 8,7 | 8,15 | 12,15 | 12,11 | 8,11 | 8,3 |
| $v_5$ | 0,2 | 0,6 | 4,6 | 4,14 | 0,14 | 0,10 | 4,10 | 4,2 | 12,2 | 12,6 | 8,6 | 8,14 | 12,14 | 12,10 | 8,10 | 8,2 |
| $v_6$ | 1,2 | 1,6 | 5,6 | 5,14 | 1,14 | 1,10 | 5,10 | 5,2 | 13,2 | 13,6 | 9,6 | 9,14 | 13,14 | 13,10 | 9,10 | 9,2 |
| $v_7$ | 1,0 | 1,4 | 5,4 | 5,12 | 1,12 | 1,8 | 5,8 | 5,0 | 13,0 | 13,4 | 9,4 | 9,12 | 13,12 | 13,8 | 9,8 | 9,0 |
| $v_8$ | 3,0 | 3,4 | 7,4 | 7,12 | 3,12 | 3,8 | 7,8 | 7,0 | 15,0 | 15,4 | 11,4 | 11,12 | 15,12 | 15,8 | 11,8 | 11,0 |
| $v_9$ | 3,1 | 3,5 | 7,5 | 7,13 | 3,13 | 3,9 | 7,9 | 7,1 | 15,1 | 15,5 | 11,5 | 11,13 | 15,13 | 15,9 | 11,9 | 11,1 |
| $v_{10}$ | 2,1 | 2,5 | 6,5 | 6,13 | 2,13 | 2,9 | 6,9 | 6,1 | 14,1 | 14,5 | 10,5 | 10,13 | 14,13 | 14,9 | 10,9 | 10,1 |
| $v_{11}$ | 2,3 | 2,7 | 6,7 | 6,15 | 2,15 | 2,11 | 6,11 | 6,3 | 14,3 | 14,7 | 10,7 | 10,15 | 14,15 | 14,11 | 10,11 | 10,3 |
| $v_{12}$ | 3,3 | 3,7 | 7,7 | 7,15 | 3,15 | 3,11 | 7,11 | 7,3 | 15,3 | 15,7 | 11,7 | 11,15 | 15,15 | 15,11 | 11,11 | 11,3 |
| $v_{13}$ | 3,2 | 3,6 | 7,6 | 7,14 | 3,14 | 3,10 | 7,10 | 7,2 | 15,2 | 15,6 | 11,6 | 11,14 | 15,14 | 15,10 | 11,10 | 11,2 |
| $v_{14}$ | 2,2 | 2,6 | 6,6 | 6,14 | 2,14 | 2,10 | 6,10 | 6,2 | 14,2 | 14,6 | 10,6 | 10,14 | 14,14 | 14,10 | 10,10 | 10,2 |
| $v_{15}$ | 2,0 | 2,4 | 6,4 | 6,12 | 2,12 | 2,8 | 6,8 | 6,0 | 14,0 | 14,4 | 10,4 | 10,12 | 14,12 | 14,8 | 10,8 | 10,0 |

FIG. 13

| cell$_{3i}$ / cell$_{3i-1}$ | $v_e$ | $v_1$ | $v_2$ | $v_3$ | $v_4$ | $v_5$ | $v_6$ | $v_7$ | $v_8$ | $v_9$ | $v_{10}$ | $v_{11}$ | $v_{12}$ | $v_{13}$ | $v_{14}$ | $v_{15}$ |
|---|---|---|---|---|---|---|---|---|---|---|---|---|---|---|---|---|
| $v_e$ | 000 | 400 | 402 | 002 | 022 | 020 | 060 | 460 | 420 | 422 | 462 | 062 | 042 | 040 | 440 | 442 |
| $v_1$ | 100 | 500 | 502 | 102 | 122 | 120 | 160 | 560 | 520 | 522 | 562 | 162 | 142 | 140 | 540 | 542 |
| $v_2$ | 101 | 501 | 503 | 103 | 123 | 121 | 161 | 561 | 521 | 523 | 563 | 163 | 143 | 141 | 541 | 543 |
| $v_3$ | 301 | 701 | 703 | 303 | 323 | 321 | 361 | 761 | 721 | 723 | 763 | 363 | 343 | 341 | 741 | 743 |
| $v_4$ | 311 | 711 | 713 | 313 | 333 | 331 | 371 | 771 | 731 | 733 | 773 | 373 | 353 | 351 | 751 | 753 |
| $v_5$ | 310 | 710 | 712 | 312 | 332 | 330 | 370 | 770 | 730 | 732 | 772 | 372 | 352 | 350 | 750 | 752 |
| $v_6$ | 300 | 700 | 702 | 302 | 322 | 320 | 360 | 760 | 720 | 722 | 762 | 362 | 342 | 340 | 740 | 742 |
| $v_7$ | 200 | 600 | 602 | 202 | 222 | 220 | 260 | 660 | 620 | 622 | 662 | 262 | 242 | 240 | 640 | 642 |
| $v_8$ | 210 | 610 | 612 | 212 | 232 | 230 | 270 | 670 | 630 | 632 | 672 | 272 | 252 | 250 | 650 | 652 |
| $v_9$ | 211 | 611 | 613 | 213 | 233 | 231 | 271 | 671 | 631 | 633 | 673 | 273 | 253 | 251 | 651 | 653 |
| $v_{10}$ | 201 | 601 | 603 | 203 | 223 | 221 | 261 | 661 | 621 | 623 | 663 | 263 | 243 | 241 | 641 | 643 |
| $v_{11}$ | 001 | 401 | 403 | 003 | 023 | 021 | 061 | 461 | 421 | 423 | 463 | 063 | 043 | 041 | 441 | 443 |
| $v_{12}$ | 011 | 411 | 413 | 013 | 033 | 031 | 071 | 471 | 431 | 433 | 473 | 073 | 053 | 051 | 451 | 453 |
| $v_{13}$ | 010 | 410 | 412 | 012 | 032 | 030 | 070 | 470 | 430 | 432 | 472 | 072 | 052 | 050 | 450 | 452 |
| $v_{14}$ | 110 | 510 | 512 | 112 | 132 | 130 | 170 | 570 | 530 | 532 | 572 | 172 | 152 | 150 | 550 | 552 |
| $v_{15}$ | 111 | 511 | 513 | 113 | 133 | 131 | 171 | 571 | 531 | 533 | 573 | 173 | 153 | 151 | 551 | 553 |

| $cell_{2i}$ \ $cell_{2i-1}$ | $v_e$ | $v_1$ | $v_2$ | $v_3$ | $v_4$ | $v_5$ | $v_6$ | $v_7$ |
|---|---|---|---|---|---|---|---|---|
| $v_e$ | | $P_0^{AP}P_1^D$ | $P_0^{EP}P_1^D$ | $P_0^{EP}P_1^H$ | $P_0^{AP}P_1^H$ | $P_0^{AP}P_1^E$ | $P_0^{EP}P_1^E$ | $P_0^{EP}P_1^A$ |
| $v_1$ | $P_0^{AP}P_1^A$ | $P_0^{AP}P_1^C$ | $P_0^{EP}P_1^C$ | $P_0^{EP}P_1^G$ | $P_0^{AP}P_1^G$ | $P_0^{AP}P_1^F$ | $P_0^{EP}P_1^F$ | $P_0^{EP}P_1^B$ |
| $v_2$ | $P_0^{AP}P_1^B$ | $P_0^{BP}P_1^C$ | $P_0^{FP}P_1^C$ | $P_0^{FP}P_1^G$ | $P_0^{BP}P_1^G$ | $P_0^{BP}P_1^F$ | $P_0^{FP}P_1^F$ | $P_0^{FP}P_1^B$ |
| $v_3$ | $P_0^{BP}P_1^B$ | $P_0^{BP}P_1^D$ | $P_0^{FP}P_1^D$ | $P_0^{FP}P_1^H$ | $P_0^{BP}P_1^H$ | $P_0^{BP}P_1^E$ | $P_0^{FP}P_1^E$ | $P_0^{FP}P_1^A$ |
| $v_4$ | $P_0^{CP}P_1^A$ | $P_0^{CP}P_1^D$ | $P_0^{GP}P_1^D$ | $P_0^{GP}P_1^H$ | $P_0^{CP}P_1^H$ | $P_0^{CP}P_1^E$ | $P_0^{GP}P_1^E$ | $P_0^{GP}P_1^A$ |
| $v_5$ | $P_0^{CP}P_1^B$ | $P_0^{CP}P_1^C$ | $P_0^{GP}P_1^C$ | $P_0^{GP}P_1^G$ | $P_0^{CP}P_1^G$ | $P_0^{CP}P_1^F$ | $P_0^{GP}P_1^F$ | $P_0^{GP}P_1^B$ |
| $v_6$ | $P_0^{DP}P_1^B$ | $P_0^{DP}P_1^C$ | $P_0^{HP}P_1^C$ | $P_0^{HP}P_1^G$ | $P_0^{DP}P_1^G$ | $P_0^{DP}P_1^F$ | $P_0^{HP}P_1^F$ | $P_0^{HP}P_1^B$ |
| $v_7$ | $P_0^{DP}P_1^A$ | $P_0^{DP}P_1^D$ | $P_0^{HP}P_1^D$ | $P_0^{HP}P_1^H$ | $P_0^{DP}P_1^H$ | $P_0^{DP}P_1^E$ | $P_0^{HP}P_1^E$ | $P_0^{HP}P_1^A$ |

FIG. 19

| cell$_{2i-1}$ \ cell$_{2i}$ | $v_0$ | $v_1$ | $v_2$ | $v_3$ | $v_4$ | $v_5$ | $v_6$ | $v_7$ |
|---|---|---|---|---|---|---|---|---|
| $v_0$ | $p_0^A$ | $p_0^A$ | $p_0^E$ | $p_0^E$ | $p_0^A$ | $p_0^A$ | $p_0^E$ | $p_0^E$ |
| $v_1$ | $p_0^A$ | $p_0^A$ | $p_0^E$ | $p_0^E$ | $p_0^A$ | $p_0^A$ | $p_0^E$ | $p_0^E$ |
| $v_2$ | $p_0^B$ | $p_0^B$ | $p_0^F$ | $p_0^F$ | $p_0^B$ | $p_0^B$ | $p_0^F$ | $p_0^F$ |
| $v_3$ | $p_0^B$ | $p_0^B$ | $p_0^F$ | $p_0^F$ | $p_0^B$ | $p_0^B$ | $p_0^F$ | $p_0^F$ |
| $v_4$ | $p_0^C$ | $p_0^C$ | $p_0^G$ | $p_0^G$ | $p_0^C$ | $p_0^C$ | $p_0^G$ | $p_0^G$ |
| $v_5$ | $p_0^C$ | $p_0^C$ | $p_0^G$ | $p_0^G$ | $p_0^C$ | $p_0^C$ | $p_0^G$ | $p_0^G$ |
| $v_6$ | $p_0^D$ | $p_0^D$ | $p_0^H$ | $p_0^H$ | $p_0^D$ | $p_0^D$ | $p_0^H$ | $p_0^H$ |
| $v_7$ | $p_0^D$ | $p_0^D$ | $p_0^H$ | $p_0^H$ | $p_0^D$ | $p_0^D$ | $p_0^H$ | $p_0^H$ |

2000

2001

| Decimal | Binary | Symbol |
|---|---|---|
| 0 | 000 | A |
| 1 | 001 | B |
| 3 | 011 | C |
| 2 | 010 | D |
| 6 | 110 | H |
| 7 | 111 | G |
| 5 | 101 | F |
| 4 | 100 | E |

| Decimal | Binary | Symbol |
|---|---|---|
| 0 | 000 | E |
| 1 | 001 | A |
| 3 | 011 | B |
| 2 | 010 | C |
| 6 | 110 | D |
| 7 | 111 | H |
| 5 | 101 | G |
| 4 | 100 | F |

2002

2004

| Decimal | Binary | Symbol |
|---|---|---|
| 0 | 000 | E |
| 1 | 001 | F |
| 3 | 011 | G |
| 2 | 010 | H |
| 6 | 110 | D |
| 7 | 111 | C |
| 5 | 101 | B |
| 4 | 100 | A |

| Decimal | Binary | Symbol |
|---|---|---|
| 0 | 000 | A |
| 1 | 001 | B |
| 3 | 011 | F |
| 2 | 010 | E |
| 6 | 110 | H |
| 7 | 111 | G |
| 5 | 101 | C |
| 4 | 100 | D |

| Decimal | Binary | Symbol |
|---|---|---|
| 0 | 00 | A |
| 1 | 01 | B |
| 3 | 11 | D |
| 2 | 10 | C |

| Decimal | Binary | Symbol |
|---|---|---|
| 0 | 00 | A |
| 1 | 01 | C |
| 3 | 11 | D |
| 2 | 10 | B |

| Decimal | Binary | Symbol |
|---|---|---|
| 0 | 00 | D |
| 1 | 01 | C |
| 3 | 11 | A |
| 2 | 10 | B |

$cell_{3i} = v_e$

| $cell_{3i-1}$ / $cell_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 0000 | 0200 | 0220 | 0222 | 2222 | 2022 | 2002 | 2000 |
| $v_1$ | 0100 | 0300 | 0320 | 0322 | 2322 | 2122 | 2102 | 2100 |
| $v_2$ | 0110 | 0310 | 0330 | 0332 | 2332 | 2132 | 2112 | 2110 |
| $v_3$ | 0111 | 0311 | 0331 | 0333 | 2333 | 2133 | 2113 | 2111 |
| $v_4$ | 1111 | 1311 | 1331 | 1333 | 3333 | 3133 | 3113 | 3111 |
| $v_5$ | 1011 | 1211 | 1231 | 1233 | 3233 | 3033 | 3013 | 3011 |
| $v_6$ | 1001 | 1201 | 1221 | 1223 | 3223 | 3023 | 3003 | 3001 |
| $v_7$ | 1000 | 1200 | 1220 | 1222 | 3222 | 3022 | 3002 | 3000 |

FIG. 26A $cell_{3i} = v_1$

| $cell_{3i-1}$ / $cell_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 0100 | 0300 | 0320 | 0322 | 2322 | 2122 | 2102 | 2100 |
| $v_1$ | 0000 | 0200 | 0220 | 0222 | 2222 | 2022 | 2002 | 2000 |
| $v_2$ | 0010 | 0210 | 0230 | 0232 | 2232 | 2032 | 2012 | 2010 |
| $v_3$ | 0011 | 0211 | 0231 | 0233 | 2233 | 2033 | 2013 | 2011 |
| $v_4$ | 1011 | 1211 | 1231 | 1233 | 3233 | 3033 | 3013 | 3011 |
| $v_5$ | 1111 | 1311 | 1331 | 1333 | 3333 | 3133 | 3113 | 3111 |
| $v_6$ | 1101 | 1301 | 1321 | 1323 | 3323 | 3123 | 3103 | 3101 |
| $v_7$ | 1100 | 1300 | 1320 | 1322 | 3322 | 3122 | 3102 | 3100 |

FIG. 26B $cell_{3i} = v_2$

| $cell_{3i-1}$ / $cell_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 0120 | 0320 | 0300 | 0302 | 2302 | 2102 | 2122 | 2120 |
| $v_1$ | 0020 | 0220 | 0200 | 0202 | 2202 | 2002 | 2022 | 2020 |
| $v_2$ | 0030 | 0230 | 0210 | 0212 | 2212 | 2012 | 2032 | 2030 |
| $v_3$ | 0031 | 0231 | 0211 | 0213 | 2213 | 2013 | 2033 | 2031 |
| $v_4$ | 1031 | 1231 | 1211 | 1213 | 3213 | 3013 | 3033 | 3031 |
| $v_5$ | 1131 | 1331 | 1311 | 1313 | 3313 | 3113 | 3133 | 3131 |
| $v_6$ | 1121 | 1321 | 1301 | 1303 | 3303 | 3103 | 3123 | 3121 |
| $v_7$ | 1120 | 1320 | 1300 | 1302 | 3302 | 3102 | 3122 | 3120 |

FIG. 26C cell$_{3i}$ = $v_3$

| cell$_{3i-1}$ / cell$_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 0121 | 0321 | 0301 | 0303 | 2303 | 2103 | 2123 | 2121 |
| $v_1$ | 0021 | 0221 | 0201 | 0203 | 2203 | 2003 | 2023 | 2021 |
| $v_2$ | 0031 | 0231 | 0211 | 0213 | 2213 | 2013 | 2033 | 2031 |
| $v_3$ | 0030 | 0230 | 0210 | 0212 | 2212 | 2012 | 2032 | 2030 |
| $v_4$ | 1030 | 1230 | 1210 | 1212 | 3212 | 3012 | 3032 | 3030 |
| $v_5$ | 1130 | 1330 | 1310 | 1312 | 3312 | 3112 | 3132 | 3130 |
| $v_6$ | 1120 | 1320 | 1300 | 1302 | 3302 | 3102 | 3122 | 3120 |
| $v_7$ | 1121 | 1321 | 1301 | 1303 | 3303 | 3103 | 3123 | 3121 |

FIG. 26D cell$_{3i}$ = $v_4$

| cell$_{3i-1}$ / cell$_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 2121 | 2321 | 2301 | 2303 | 0303 | 0103 | 0123 | 0121 |
| $v_1$ | 2021 | 2221 | 2201 | 2203 | 0203 | 0003 | 0023 | 0021 |
| $v_2$ | 2031 | 2231 | 2211 | 2213 | 0213 | 0013 | 0033 | 0031 |
| $v_3$ | 2030 | 2230 | 2210 | 2212 | 0212 | 0012 | 0032 | 0030 |
| $v_4$ | 3030 | 3230 | 3210 | 3212 | 1212 | 1012 | 1032 | 1030 |
| $v_5$ | 3130 | 3330 | 3310 | 3312 | 1312 | 1112 | 1132 | 1130 |
| $v_6$ | 3120 | 3320 | 3300 | 3302 | 1302 | 1102 | 1122 | 1120 |
| $v_7$ | 3121 | 3321 | 3301 | 3303 | 1303 | 1103 | 1123 | 1121 |

FIG. 26E cell$_{3i}$ = $v_5$

| cell$_{3i-1}$ / cell$_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 2021 | 2221 | 2201 | 2203 | 0203 | 0003 | 0023 | 0021 |
| $v_1$ | 2121 | 2321 | 2301 | 2303 | 0303 | 0103 | 0123 | 0121 |
| $v_2$ | 2131 | 2331 | 2311 | 2313 | 0313 | 0113 | 0133 | 0131 |
| $v_3$ | 2130 | 2330 | 2310 | 2312 | 0312 | 0112 | 0132 | 0130 |
| $v_4$ | 3130 | 3330 | 3310 | 3312 | 1312 | 1112 | 1132 | 1130 |
| $v_5$ | 3030 | 3230 | 3210 | 3212 | 1212 | 1012 | 1032 | 1030 |
| $v_6$ | 3020 | 3220 | 3200 | 3202 | 1202 | 1002 | 1022 | 1020 |
| $v_7$ | 3021 | 3221 | 3201 | 3203 | 1203 | 1003 | 1023 | 1021 |

FIG. 26F $cell_{3i} = v_6$

| $cell_{3i-1}$ $cell_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 2001 | 2201 | 2221 | 2223 | 0223 | 0023 | 0003 | 0001 |
| $v_1$ | 2101 | 2301 | 2321 | 2323 | 0323 | 0123 | 0103 | 0101 |
| $v_2$ | 2111 | 2311 | 2331 | 2333 | 0333 | 0133 | 0113 | 0111 |
| $v_3$ | 2110 | 2310 | 2330 | 2332 | 0332 | 0132 | 0112 | 0110 |
| $v_4$ | 3110 | 3310 | 3330 | 3332 | 1332 | 1132 | 1112 | 1110 |
| $v_5$ | 3010 | 3210 | 3230 | 3232 | 1232 | 1032 | 1012 | 1010 |
| $v_6$ | 3000 | 3200 | 3220 | 3222 | 1222 | 1022 | 1002 | 1000 |
| $v_7$ | 3001 | 3201 | 3221 | 3223 | 1223 | 1023 | 1003 | 1001 |

FIG. 26G $cell_{3i} = v_7$

| $cell_{3i-1}$ $cell_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 2000 | 2200 | 2220 | 2222 | 0222 | 0022 | 0002 | 0000 |
| $v_1$ | 2100 | 2300 | 2320 | 2322 | 0322 | 0122 | 0102 | 0100 |
| $v_2$ | 2110 | 2310 | 2330 | 2332 | 0332 | 0132 | 0112 | 0110 |
| $v_3$ | 2111 | 2311 | 2331 | 2333 | 0333 | 0133 | 0113 | 0111 |
| $v_4$ | 3111 | 3311 | 3331 | 3333 | 1333 | 1133 | 1113 | 1111 |
| $v_5$ | 3011 | 3211 | 3231 | 3233 | 1233 | 1033 | 1013 | 1011 |
| $v_6$ | 3001 | 3201 | 3221 | 3223 | 1223 | 1023 | 1003 | 1001 |
| $v_7$ | 3000 | 3200 | 3220 | 3222 | 1222 | 1022 | 1002 | 1000 |

FIG. 26H $cell_{3i} = v_e$

| cell$_{3i-1}$ / cell$_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 0000 | 0200 | 0220 | 0222 | 2222 | 2022 | 2002 | 2000 |
| $v_1$ | 0100 | 0300 | 0320 | 0322 | 2322 | 2122 | 2102 | 2100 |
| $v_2$ | 0110 | 0310 | 0330 | 0332 | 2332 | 2132 | 2112 | 2110 |
| $v_3$ | 0111 | 0311 | 0331 | 0333 | 2333 | 2133 | 2113 | 2111 |
| $v_4$ | 1111 | 1311 | 1331 | 1333 | 3333 | 3133 | 3113 | 3111 |
| $v_5$ | 1011 | 1211 | 1231 | 1233 | 3233 | 3033 | 3013 | 3011 |
| $v_6$ | 1001 | 1201 | 1221 | 1223 | 3223 | 3023 | 3003 | 3001 |
| $v_7$ | 1000 | 1200 | 1220 | 1222 | 3222 | 3022 | 3002 | 3000 |

FIG. 27A $cell_{3i} = v_1$

| cell$_{3i-1}$ / cell$_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | | | | | | | | |
| $v_1$ | | | | | | | | |
| $v_2$ | 0010 | 0210 | 0230 | 0232 | 2232 | 2032 | 2012 | 2010 |
| $v_3$ | 0011 | 0211 | 0231 | 0233 | 2233 | 2033 | 2013 | 2011 |
| $v_4$ | | | | | | | | |
| $v_5$ | | | | | | | | |
| $v_6$ | 1101 | 1301 | 1321 | 1323 | 3323 | 3123 | 3103 | 3101 |
| $v_7$ | 1100 | 1300 | 1320 | 1322 | 3322 | 3122 | 3102 | 3100 |

FIG. 27B $cell_{3i} = v_2$

| cell$_{3i-1}$ / cell$_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 0120 | | | 0302 | 2302 | | | 2120 |
| $v_1$ | 0020 | | | 0202 | 2202 | | | 2020 |
| $v_2$ | 0030 | | | 0212 | 2212 | | | 2030 |
| $v_3$ | 0031 | | | 0213 | 2213 | | | 2031 |
| $v_4$ | 1031 | | | 1213 | 3213 | | | 3031 |
| $v_5$ | 1131 | | | 1313 | 3313 | | | 3131 |
| $v_6$ | 1121 | | | 1303 | 3303 | | | 3121 |
| $v_7$ | 1120 | | | 1302 | 3302 | | | 3120 |

FIG. 27C cell$_{3i}$ = $v_3$

| cell$_{3i-2}$ \ cell$_{3i-1}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 0121 | 0321 | 0301 | 0303 | 2303 | 2103 | 2123 | 2121 |
| $v_1$ | 0021 | 0221 | 0201 | 0203 | 2203 | 2003 | 2023 | 2021 |
| $v_2$ | | | | | | | | |
| $v_3$ | | | | | | | | |
| $v_4$ | 1030 | 1230 | 1210 | 1212 | 3212 | 3012 | 3032 | 3030 |
| $v_5$ | 1130 | 1330 | 1310 | 1312 | 3312 | 3112 | 3132 | 3130 |
| $v_6$ | | | | | | | | |
| $v_7$ | | | | | | | | |

FIG. 27D cell$_{3i}$ = $v_4$

| cell$_{3i-2}$ \ cell$_{3i-1}$ | $v_e$ | $v_1$ | $v_2$ | $v_3$ | $v_4$ | $v_5$ | $v_6$ | $v_7$ |
|---|---|---|---|---|---|---|---|---|
| $v_e$ | | 2321 | 2301 | | | 0103 | 0123 | |
| $v_1$ | | 2221 | 2201 | | | 0003 | 0023 | |
| $v_2$ | | 2231 | 2211 | | | 0013 | 0033 | |
| $v_3$ | | 2230 | 2210 | | | 0012 | 0032 | |
| $v_4$ | | 3230 | 3210 | | | 1012 | 1032 | |
| $v_5$ | | 3330 | 3310 | | | 1112 | 1132 | |
| $v_6$ | | 3320 | 3300 | | | 1102 | 1122 | |
| $v_7$ | | 3321 | 3301 | | | 1103 | 1123 | |

FIG. 27E cell$_{3i}$ = $v_5$

| cell$_{3i-2}$ \ cell$_{3i-1}$ | $v_e$ | $v_1$ | $v_2$ | $v_3$ | $v_4$ | $v_5$ | $v_6$ | $v_7$ |
|---|---|---|---|---|---|---|---|---|
| $v_e$ | | | | | | | | |
| $v_1$ | | | | | | | | |
| $v_2$ | 2131 | 2331 | 2311 | 2313 | 0313 | 0113 | 0133 | 0131 |
| $v_3$ | 2130 | 2330 | 2310 | 2312 | 0312 | 0112 | 0132 | 0130 |
| $v_4$ | | | | | | | | |
| $v_5$ | | | | | | | | |
| $v_6$ | 3020 | 3220 | 3200 | 3202 | 1202 | 1002 | 1022 | 1020 |
| $v_7$ | 3021 | 3221 | 3201 | 3203 | 1203 | 1003 | 1023 | 1021 |

FIG. 27F $cell_{3i} = v_6$

| $cell_{3i-1}$ $cell_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | 2001 | | | 2223 | 0223 | | | 0001 |
| $v_1$ | 2101 | | | 2323 | 0323 | | | 0101 |
| $v_2$ | | | | | | | | |
| $v_3$ | | | | | | | | |
| $v_4$ | 3110 | | | 3332 | 1332 | | | 1110 |
| $v_5$ | 3010 | | | 3232 | 1232 | | | 1010 |
| $v_6$ | | | | | | | | |
| $v_7$ | | | | | | | | |

FIG. 27G $cell_{3i} = v_7$

| $cell_{3i-1}$ $cell_{3i-2}$ | $v_e$ | $v_1$ | $v_2$ | $v_3$ | $v_4$ | $v_5$ | $v_6$ | $v_7$ |
|---|---|---|---|---|---|---|---|---|
| $v_e$ | | 2200 | 2220 | | | 0022 | 0002 | |
| $v_1$ | | 2300 | 2320 | | | 0122 | 0102 | |
| $v_2$ | | | | | | | | |
| $v_3$ | | | | | | | | |
| $v_4$ | | 3311 | 3331 | | | 1133 | 1113 | |
| $v_5$ | | 3211 | 3231 | | | 1033 | 1013 | |
| $v_6$ | | | | | | | | |
| $v_7$ | | | | | | | | |

FIG. 27H

MULTI-CELL MODULATION FOR FLASH MEMORY

FIELD

Embodiments described herein relate generally to methods and devices for modulating data over a plurality of flash memory cells.

BACKGROUND

Memory cells in NAND flash memory consist of field effect transistors that comprise a floating gate interposed between the gate and the channel. In order to determine the storage state of the memory cell, a first bias voltage is applied to the gate of the memory cell while a second bias voltage is applied across the channel of the memory cell.

During the reading process at least one bias voltage is applied to the gate of the memory cell. In a NAND flash memory the conductivity of the memory cell's channel is defined by the amount of charge stored on the floating gate and by the bias voltage applied to the gate of said memory cell.

By sensing the source-drain current that flows through the channel of a flash memory cell; the reading process can determine the amount of charge stored in the floating gate and consequently the data value stored by the flash memory cell.

Unlike ideal transistors, practical memory cells are subject to various types of impairments that affect their performance, such as inaccurate programming, retention noise, random telegraph noise, device aging and inter cell interference. These impairments can influence the conductivity of the memory cell being read, thereby potentially falsifying the perceived storage state of the cell in question.

As flash memory architectures continue to be miniaturised these effects will become more pronounced, thereby presenting a challenge to the accurate determination of a memory cell's storage state. In light of this a new approach to storing data in flash memory cells is required which enables data to be stored accurately.

Arrangements of the embodiments will be understood and appreciated more fully from the following detailed description, made by way of example only and taken in conjunction with drawings in which:

FIG. 9 shows a multi-cell mapping from decimal data values to memory cell write voltages according to an embodiment;

FIG. 13 shows a demodulation mapping of three logical pages written over two quadruple level cells;

FIG. 14 shows a part of a demodulation mapping of three logical pages written over three quadruple level cells;

FIG. 15 shows a part of a demodulation mapping of four logical pages written over three quadruple level cells;

FIG. 19 shows a generalised mapping of two logical pages over two Triple-level-cells according to an embodiment;

FIG. 20 shows a generalised mapping for a first logical page over two Triple-level-cells according to an embodiment;

FIG. 21 shows a generalised demodulation mapping where three logical pages are written over two triple level cells;

FIG. 22 shows a plurality of value mapping which could be used for a logical page of the mapping shown in FIG. 21;

FIG. 23 shows a generalised demodulation mapping of two logical pages written over two quadruple level cells;

FIG. 24 shows part of a generalised demodulation mapping of three logical pages written over three quadruple level cells;

FIG. 25 shows a generalised demodulation mapping of four logical pages written over three quadruple level cells;

FIGS. 26A-H show a demodulation mapping of four logical pages written over three triple level cells;

FIGS. 27A-H show a demodulation mapping of four logical pages written over three triple level cells where duplicate entries are removed.

DETAILED DESCRIPTION

According to a first aspect there is provided a method of storing a number of data values in a plurality of flash memory cells wherein each flash memory cell has a plurality of storage states and each data value is selected from a set of possible data values. The method comprises programming the number of data values to the plurality of flash memory cells using a mapping which uniquely associates each combination of storage states for the plurality of flash memory cells with a concatenated data value from a set of concatenated data values. The set of concatenated data values comprises a concatenated data value for every combination of possible data values for the number of data values. The concatenated data value has a position for each data value in the number of data values. The mapping is such that between adjacent storage states all but one data values are identical and each position in the concatenated data value changes the data value it represents between the same storage states on each flash memory cell.

Figure 8:
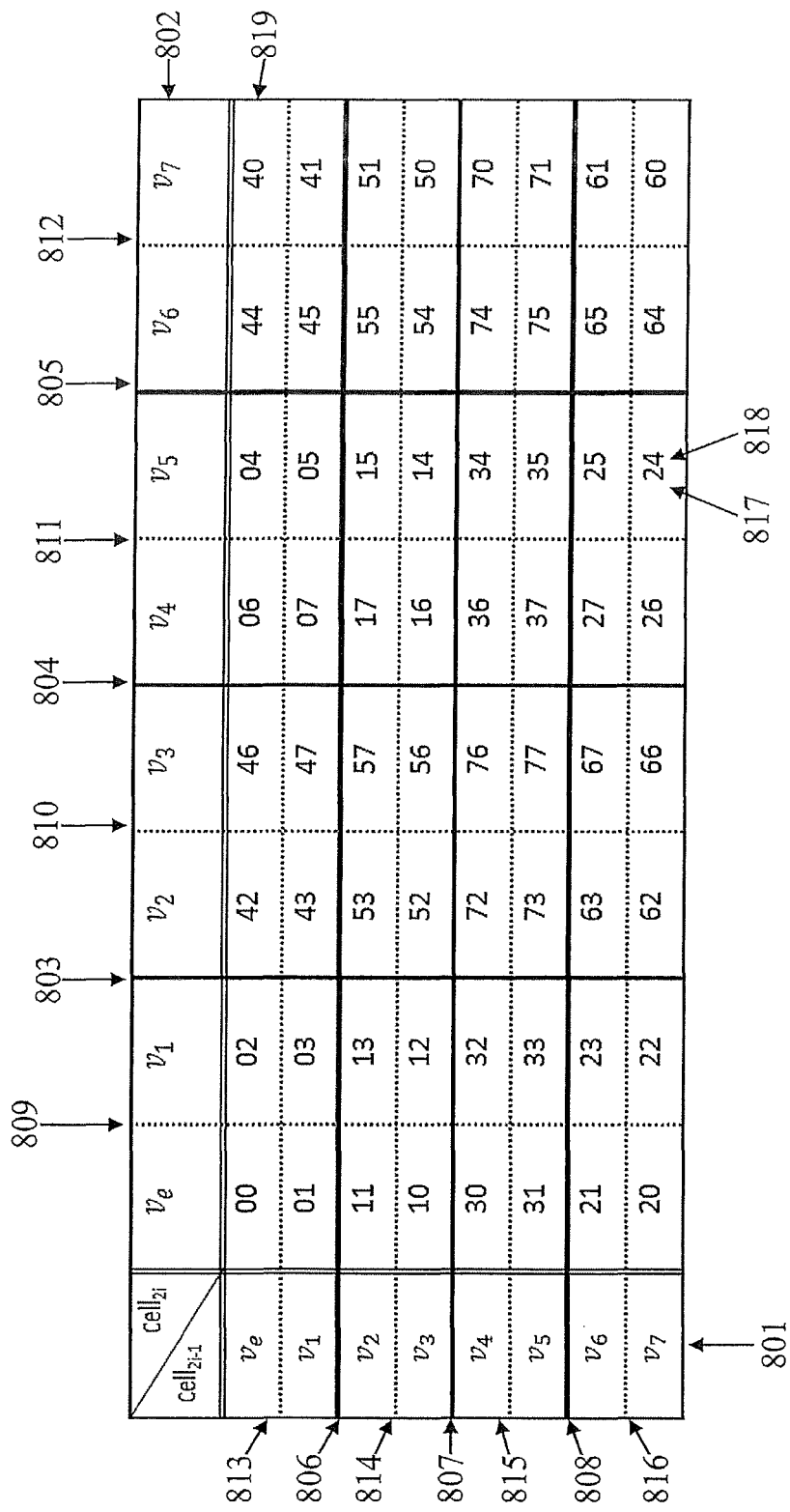
FIG. 8 shows a mapping of two logical pages over two Triple-level-cells according to an embodiment.

One example of such a storage method is shown in FIG. 8. There the number of data values equals 2 and the plurality of flash memory cells comprises $cell_{2i}$ and $cell_{2i-1}$. In this example each flash memory cell has a plurality of storage states (e.g. $v_e$, $v_1$, $v_2$, $v_3$, $v_4$, $v_5$, $v_6$ and $v_7$) and the set of possible data values comprises the decimal numbers 0, 1, 2, 3, 4, 5, 6, 7.

In FIG. 8 the combination of storage states for the plurality of flash memory cells is represented as a 2D array. For example, a first combination of storage states is $v_e$ for $cell_{2i}$ and $v_e$ for $cell_{2i-1}$, a second combination of storage states is $v_e$ for $cell_{2i}$ and $v_1$ for $cell_{2i-1}$, a third combination of storage states is $v_e$ for $cell_{2i}$ and $v_2$ for $cell_{2i-1}$ and so on. Each entry in the mapping of FIG. 8 represents a concatenated data value. For example, the entry corresponding to the storage states $v_1v_1$ is "03".

As can be seen from FIG. 8, only one combination of storage states represents the concatenated data value "03", that being $v_1v_1$. In this way the mapping uniquely associates combinations of storage states with a concatenated data value.

The set of concatenated data values represents each combination of possible values for the number of data values. For example, the first data value could be any number from 0 to 7 (i.e. any value from the set of possible data values). Likewise, the second data value could be any number from 0 to 7. In light of this, the possible combinations for the number of data values include: "00", "01", "02", "03", "04", "05", "06", "07", "10", "11", "12", "13", "14", "15", "16", "17", "20", "21" . . . etc. In total there are 64 possible combinations of the first and second data value (i.e. 8×8). Each possible combination is uniquely represented by a combination of storage states.

An entry in the mapping of FIG. 8 represents a concatenated data value. For example, the entry "03" represents a concatenation of a first data value "0" and a second data value "3". In this entry a first position is occupied by the first data value of "0" and a second position is occupied by the second data value of "3".

The mapping in FIG. 8 is such that between adjacent storage states all but one data values are identical. Storage states of a flash memory cell (e.g. $v_e$, $v_1$, $v_2$, $v_3$, $v_4$, $v_5$, $v_6$ and $v_7$) are adjacent if their write voltages are successive in a sorted sequence. For example, the storage state $v_3$ is adjacent to the storage state $v_2$ and the storage state $v_4$. Likewise the storage state $v_5$ is adjacent to the storage state $v_4$ and the storage state $v_6$.

In FIG. 8, between storage states $v_1$ and $v_2$ on $cell_{2i}$ (i.e. adjacent storage states) only one data value changes, that being the data value in the first position. For example, when $cell_{2i-1}$ equals $v_e$ the concatenated data value changes between $v_1$ and $v_2$ on $cell_{2i}$ from "02" to "42". Here only the data value in the first position changes, in this case from "0" to "4". All other data values (i.e. the data value in the second position) are identical. Here the data value represented by the first position in the concatenated data value changes value (from "0" to "4"). This transition occurred between storage states $v_1$ and $v_2$ on $cell_{2i}$.

Likewise between the storage states $v_1$ and $v_2$ on $cell_{2i-1}$ the data value represented by the first position also changes. For example, when $cell_{2i}=v_e$, between $v_1$ and $v_2$ on $cell_{2i-1}$ the concatenated data value changes from "01" to "11". Here only the data value represented by the first position changes, in keeping with the same decision boundary on the other flash memory cell.

In essence, the above-described method of storing data has the following features: each possible combination of storage states is associated with a unique stored data value (e.g. "00" is only represented by the storage state $v_e$, $v_e$); the position of the decision boundaries for each logical page are the same on each memory cell (e.g. In FIG. 8, for the second logical page; 809 and 813, 810 and 814, 811 and 815, 812 and 816); and the decision boundaries for each logical page are different (e.g. In FIG. 8, ref. 809 for the second logical page, ref. 803 for the first logical page).

In an embodiment the two storage states are adjacent if their write voltages are successive in a sorted sequence of the write voltages for the plurality of storage states.

In an embodiment a number of concatenated data values in the set of concatenated data values equals the number of combinations of storage states for the plurality of flash memory cells.

For example, in FIG. 8 the number of concatenated data values in the set of concatenated data values equals 64 (i.e. there are 8 possible values for each data value, therefore there are 64 possible combinations of data values). Likewise in FIG. 8 each flash memory cell has 8 storage states, therefore there are 64 possible combinations of the storage states for the plurality of flash memory cells. Here the number of concatenated data values in the set of concatenated data values (i.e. 64) equals the number of combinations of storage states for the plurality of flash memory cells (i.e. 64).

In essence, the above-described method of storing data has the following feature: each possible combination of storage states (e.g. $v_e$ to $v_7$, for each memory cell) is associated with a stored data value (i.e. there is no empty space in the mapping).

For a given flash memory cell, the number of times a position in the concatenated data value changes the data value it represents may differ by at most 1 from the number of times any other position in the concatenated data value changes the data value it represents.

For example, in FIG. 8, for a given flash memory cell (i.e. $cell_{2i}$) the first position in the concatenated data value changes its value 3 times. These being between $v_1$ and $v_2$, between $v_3$ and $v_4$ and between $v_5$ and $v_6$. In FIG. 8 the second position in the concatenated data value changes its value 4 times, namely: between $v_e$ and $v_1$, between $v_2$ and $v_3$, between $v_4$ and $v_5$ and between $v_6$ and $v_7$. Here the number of times the first position changes value (3 times) is at most 1 more or less than the number of times that the second position changes value (4 times).

In essence, the above-described method of storing data has the following feature: for each memory cell, the number of decision boundaries for each logical page (e.g. 809, 810, 811, 812 for the second logical page; 803; 804; 805 for the first logical page) differs by at most 1 (i.e. a balanced coding scheme).

The data value represented by a position of the concatenated data value may differ between adjacent storage states by at most one binary digit in a binary representation.

For example, in FIG. 8 when $\text{cell}_{2i-1}$ equals $v_e$ the concatenated data value changes between $v_1$ and $v_2$ from "02" to "42". Here only the data value in the first position changes, in this case from "0" to "4". The binary representation of this value change is from "000" to "100". Here only 1 binary digit has changed value (i.e. the MSB from "0" to "1").

In essence, the above-described method of storing data has the following feature: The data value stored on a logical page either side of a decision boundary (e.g. ref. 809) differs by 1 binary digit (e.g. 0→2) (i.e. Gray coding).

In an embodiment the method further comprises based on the mapping determining, for each memory cell, which group of storage states each memory cell has been programmed to by reading the memory cell, wherein a group of storage states within a memory cell is associated with fewer than all possible storage states. Based on the mapping and on identified groups of storage states in all of the number of memory cells the method may determine at least one data value from the concatenated data value and output the determined data value.

For example, in FIG. 8 all possible storage states for a cell (e.g. cellr) are $v_e$, $v_1$, $v_2$, $v_3$, $v_4$, $v_5$, $v_6$ and $v_7$. A group of storage states could be $v_e$, $v_1$. Upon determining that both cells have been programmed to the group of storage states comprising $v_e$, $v_1$ it is determined, from the mapping, that the concatenated data value is one of "00", "01", "02" and "03". From this is it possible to determine that one of the data values is "0", since this value does not change amongst all the possible concatenated data values.

In an embodiment each flash memory cell has eight storage states, a number of memory cells equals two, the number of data values equals two and wherein the mapping is shown by FIG. 19.

Figure 21:
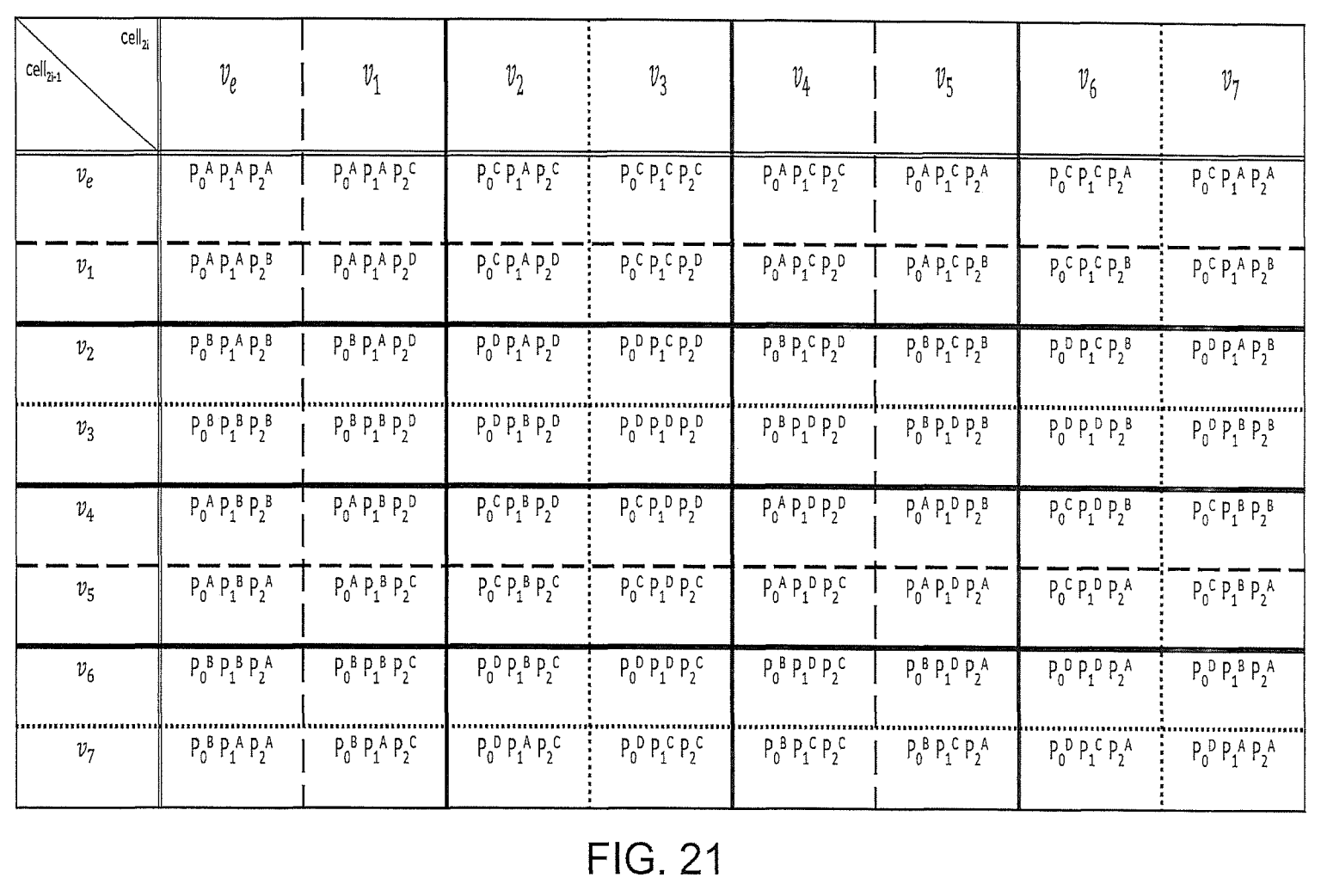

In an embodiment each flash memory cell has eight storage states, a number of memory cells equals two, the number of data values equals three and wherein the mapping is shown by FIG. 21.

Figure 23:
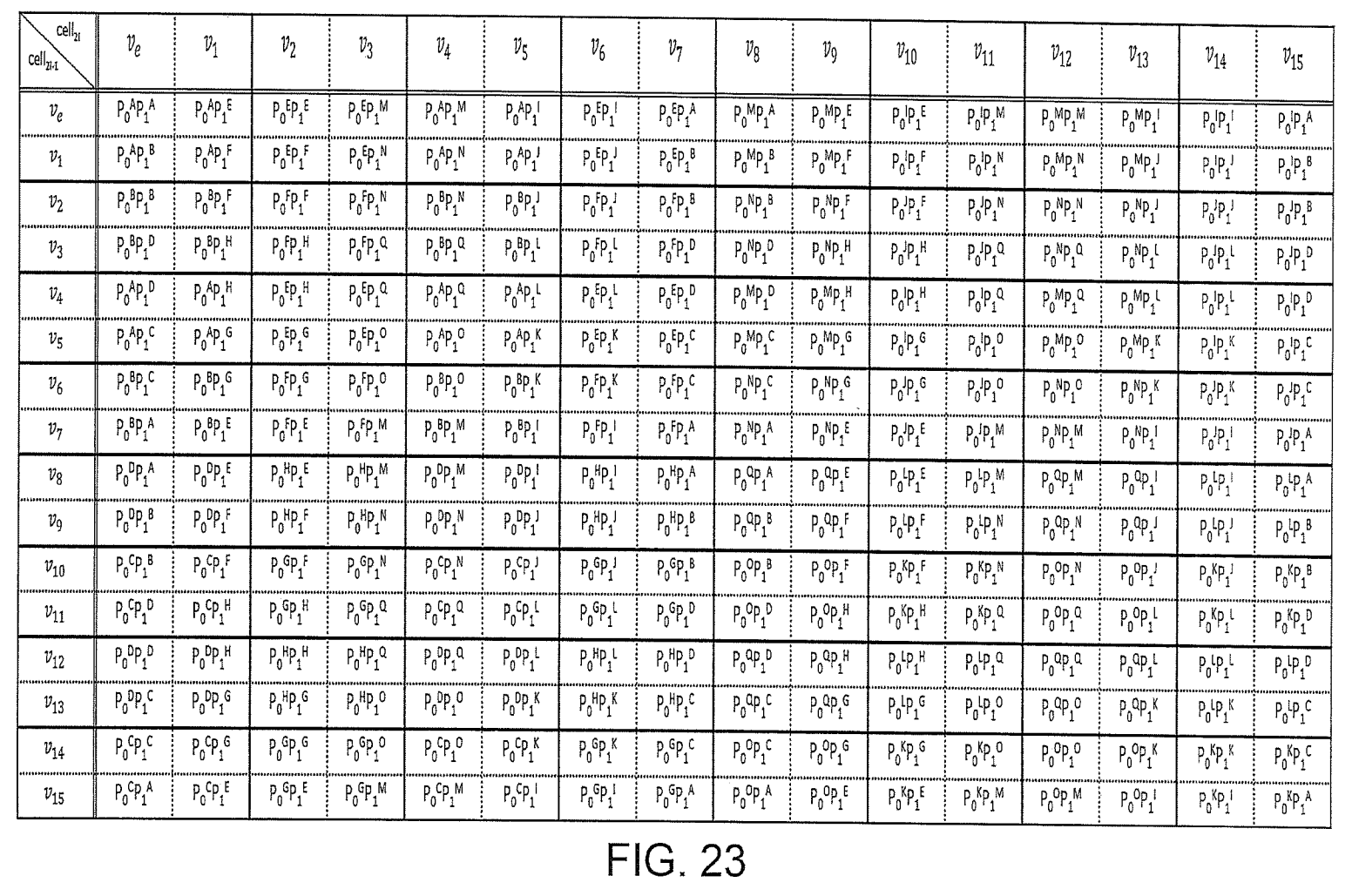

In an embodiment each flash memory cell has sixteen storage states, a number of memory cells equals two, the number of data values equals two and wherein the mapping is shown by FIG. 23.

Figure 24:
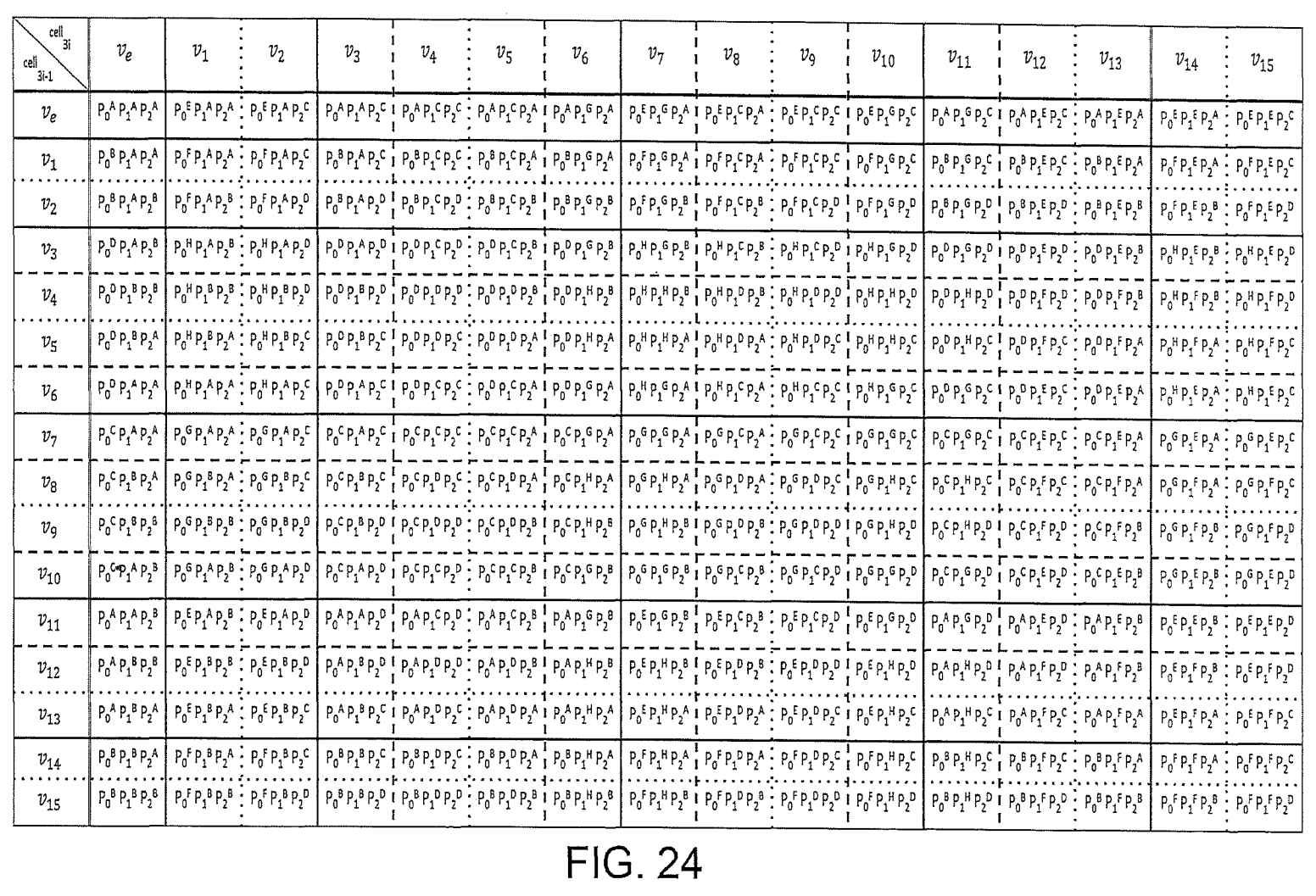

In an embodiment each flash memory cell has sixteen storage states, a number of memory cells equals three, the number of data values equals three and wherein the mapping is shown by FIG. 24.

According to a second aspect there is provided a device for storing a number of data values in a plurality of flash memory cells wherein each flash memory cell has a plurality of storage states and each data value is selected from a set of possible data values. The device comprising a processor and a memory storing instruction for execution by the processor. The instructions causing the processor when executing the instructions to: program the number of data values to the plurality of flash memory cells using a mapping which uniquely associates each combination of storage states for the plurality of flash memory cells with a concatenated data value from a set of concatenated data values, wherein: the set of concatenated data values comprises a concatenated data value for every combination of possible data values for the number of data values; and the concatenated data value has a position for each data value in the number of data values. The mapping being such that between adjacent storage states all but one data values are identical; and each position in the concatenated data value changes the data value it represents between the same storage states on each flash memory cell.

In an embodiment a number of concatenated data values in the set of concatenated data values equals the number of combinations of storage states for the plurality of flash memory cells.

In an embodiment, for a given flash memory cell, the number of times a position in the concatenated data value changes the data value it represents differs by at most 1 from the number of times any other position in the concatenated data value changes the data value it represents.

In an embodiment the data value represented by a position of the concatenated data value differs between adjacent storage states by at most one binary digit in a binary representation.

In an embodiment the instructions further cause the processor to: determine, for each memory cell, which group of storage states each memory cell has been programmed to by reading the memory cell, wherein a group of storage states within a memory cell is associated with fewer than all possible storage states. The instructions, when executed by the processor, further cause the processor to: based on the mapping and on identified groups of storage states in all of the number of memory cells determine at least one data value from the concatenated data value; and output the determined data value.

In an embodiment each flash memory cell memory cell has eight storage states, a number of memory cells equals two, the number of data values equals two and wherein the mapping is shown by FIG. 19.

In an embodiment each flash memory cell has eight storage states, a number of memory cells equals two, the number of data values equals three and wherein the mapping is shown by FIG. 21.

In an embodiment each flash memory cell has sixteen storage states, a number of memory cells equals two, the number of data values equals two and wherein the mapping is shown by FIG. 23.

In an embodiment each flash memory cell has sixteen storage states, a number of memory cells equals three, the number of data values equals three and wherein the mapping is shown by FIG. 24.

Also disclosed is a flash memory comprising a plurality of flash memory cells and the device for storing a number of data values in a plurality of flash memory cells as discussed above (and/or claimed in claim 10), the flash memory being configured to store data in the plurality of flash memory cells using the device.

Figure 1:
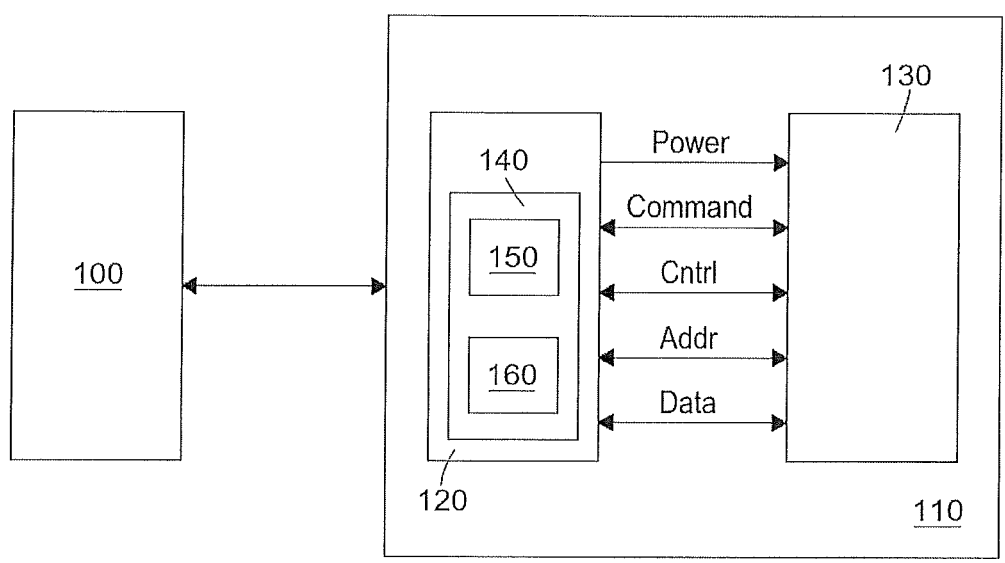
FIG. 1 shows a system comprising a computing device and non-volatile Flash storage memory.

FIG. 1 shows a system comprising a computing device 100 and non-volatile Flash storage memory 110. The computing device may be a mobile computing device, such as a mobile phone, tablet computer, laptop, camera or any other type of mobile computing device. Alternatively the computing device 100 may be stationary, such as a desktop computer or indeed part of a stationary server or part of a storage bank, such as part of a RAID solution.

The non-volatile Flash storage memory 110 may take any form of non-volatile storage device comprising Flash memory. The non-volatile Flash storage memory 110 may, for example, be a "thumb drive", a solid-state drive (SSD) or a memory card.

The computing device 100 and the non-volatile Flash storage memory 110 are in communicative connection with each other in a manner that allows the computing device 100 to transmit data and commands indicating the processing that the data is to be subjected to by the non-volatile Flash storage memory 110. The communicative connection also allows the non-volatile Flash storage memory 110 to return data retrieved from memory to the computing device 100.

The computing device 100 may also provide power to the non-volatile Flash storage memory 110.

A number of interfaces that allow communication between a computing device 100 and a non-volatile Flash storage memory 110 are known. The exact nature of the interface is not pertinent to the embodiments however exemplary interfaces include the USB interface, SD, microSD, xD, CompactFlash, MMC, to name but a few.

The non-volatile Flash storage memory 110 comprises a memory controller 120 and a non-volatile flash memory 130. The memory controller 120 interfaces with the computing device 100 as well as with the flash memory 130. The memory controller 120 provides power to the flash memory 130 and is moreover connected to the flash memory 130 via command, control, address and data lines. The memory controller 120 may control all of the operations of the flash memory 130.

The memory controller 120 comprises a control unit 140 which is configured to write data to the non-volatile flash memory 130 and read data from the non-volatile flash memory 130. The control unit 140 comprises a processor 150 and a memory 160. In FIG. 1 the processor 150 is communicatively coupled to the memory 160. The processor 150 is also communicatively coupled to the non-volatile flash memory 130 via the command, control, address and data lines. The memory 160 stores computer readable instructions that, when executed by the microprocessor 150, cause the microprocessor 150 to read and write data to and from the non-volatile flash memory 130 using the methods described herein.

Figure 2:
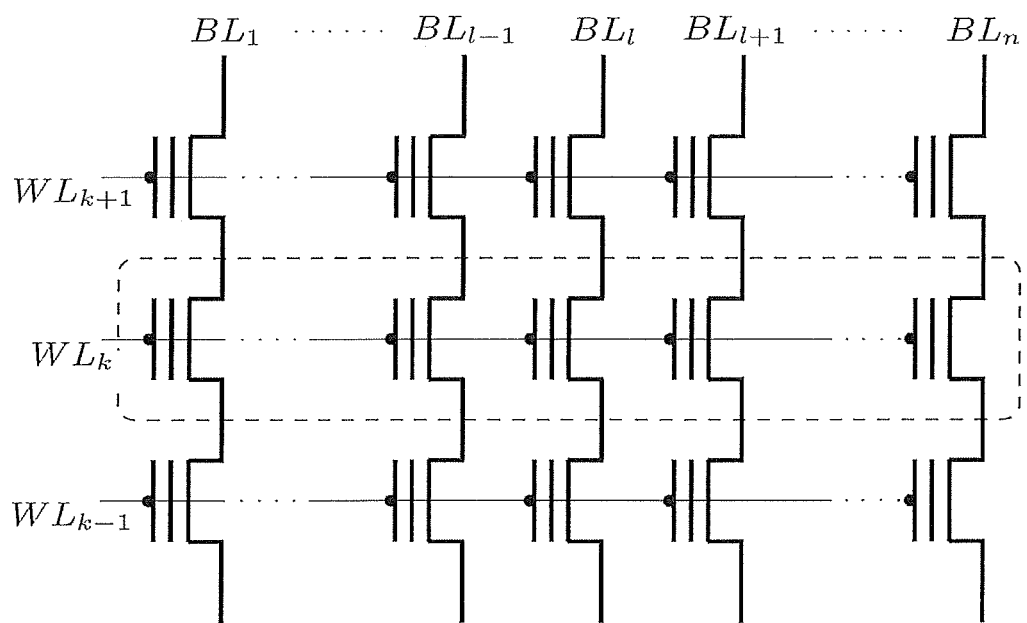
FIG. 2 shows an exemplary NAND flash memory.

FIG. 2 shows an exemplary NAND flash memory. As shown in FIG. 2, memory cells in NAND flash memory consist of field effect transistors (FET's) comprising a floating gate interposed between the FET's gate and channel.

NAND flash memory cells are organised into multiple blocks. Memory cells within each block are arranged horizontally along word-lines. These word-line connect the gates of horizontally adjacent FETs and are labelled in FIG. 2 as $WL_{k+1}$, $WL_k$ and $WL_{k-1}$.

Memory cells within each block are also arranged vertically along (often thousands of) bit-lines (labelled as $BL_1$ to $BL_n$ in FIG. 2), which connect the drains and the sources of vertically adjacent FETs. The control gates of all the cells along a word-line are connected to the address bus while the drains of the cells along a bit-line are connected to the data bus.

Figure 3:
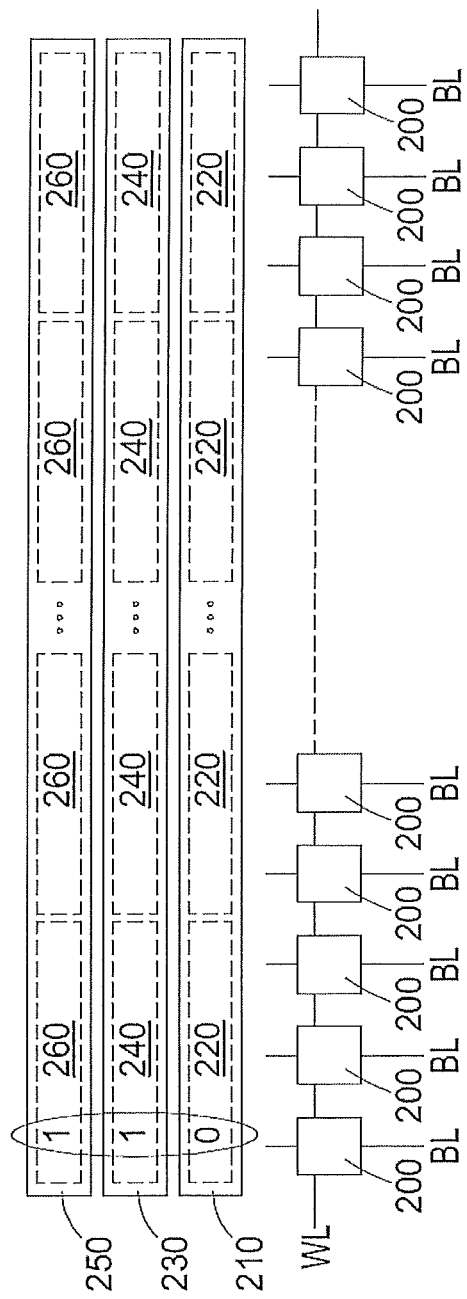
FIG. 3 shows a number of memory cells arranged along a word-line (WL)

FIG. 3 shows a number of memory cells 200 arranged along a word-line (WL). Although only a few memory cells 200 are shown in FIG. 3, several thousand memory cells may be arranged along each word-line (VVL). Several word-lines (VVL) tend to be arranged so that their memory cells are connected (in FIG. 3 in the vertical direction) along bit lines BLs. In an embodiment all memory cells along a word line WL are programmed simultaneously.

In FIG. 3 each of the memory cells 200 is a Triple-level cell (TLC) where each memory cells has 8 different storage states and is therefore able to store three bits of data. In flash memory systems it is possible to split each word-line into $\log_2 M$ logical pages where M is the number of threshold voltages (or storages states) that a memory cell has. For example, in the case of a Triple-level cell where each cell has 8 storage states the wordline can be split into 3 logical pages. This can be seen in FIG. 3 which shows the logical page of the MSB as 250, the logical page of the LSB as 210 and the logical page of the middle bit as 230.

Data bits stored in the logical pages of a memory cell may be independent from each other. For example, a first logical page is programmed to a group of memory cells before a second or further logical page is programmed to the same group of memory cells.

In a first programming pass a first set of logical pages 220 are programmed to the memory cells along word line WL. In the example shown in FIG. 3 the information stored in the left-most memory cell is a binary '0'. In a second programming pass a second set of logical pages 240 are programmed to the memory cells along word line WL. In the example shown in FIG. 3 the information stored in the left-most memory cell is now the binary value '10'. In a third programming pass a third set of logical pages 260 are programmed to the memory cells along word line WL. In the example shown in FIG. 3 the information stored in the left-most memory cell is now the binary '110'.

In order to determine the storage state of a memory cell a bias voltage is applied to the word line of the memory cell in question and a separate bias voltage is applied across the memory cell's channel. A gate voltage is also applied to all other memory cells in the bit line. This ensures the rest of the memory cells in the bit line are in a fully conductive state thereby enabling the bias voltage applied along the bit-line, to the largest extent possible, to be seen across the channel of the memory cell to be read.

As shown in FIG. 3, each logical page may comprise smaller sub-units 220, 240, 250. The sub-units are often referred to as code words and refer to a string of data that has its own error correction codes associated with it.

Although in FIG. 3 the memory cells 200 are Triple-level Cells (TLCs) with eight storage states, it is emphasized that the memory cells could instead be Single-level Cells (SLCs) where it is sufficient to only distinguish between two storage states (i.e. a binary '1' and '0') or Quad-level Cells (QLCs) where it is necessary to distinguish between sixteen storage states (or four bits).

Unlike ideal transistors, practical flash memory cells are subject to various types of impairments that affect their performance, such as inaccurate programming, retention noise, random telegraph noise, device aging and inter cell interference. These impairments can influence the conductivity of the memory cell being read, thereby potentially falsifying the perceived storage state of the cell in question.

As flash memory architectures continue to be miniaturised these effects will become more pronounced, thereby presenting a challenge to the accurate determination of the data value stored in a memory cell.

Figure 4:
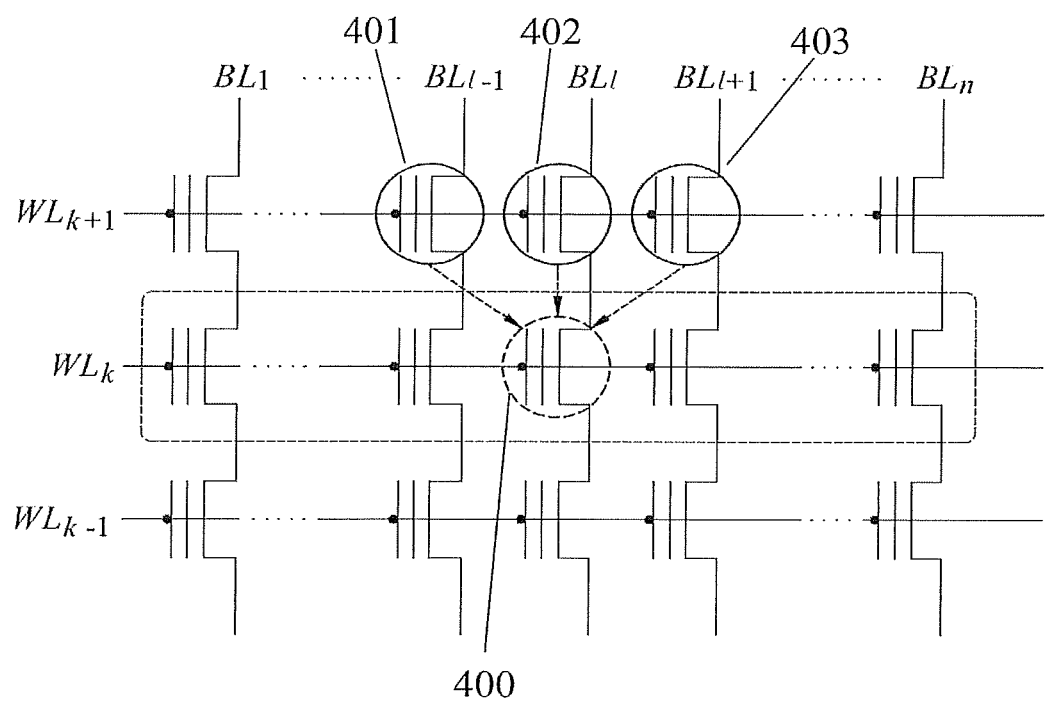
FIG. 4 shows a graphical representation of impairments in a flash memory cell.

FIG. 4 shows a graphical representation of impairments in a flash memory cell. FIG. 4 shows a memory cell 400 which is the subject of inter-cell interference from a first neighbouring cell 401, a second neighbouring cell 402 and a third neighbouring cell 403. FIG. 4 shows how the charges stored on the floating gates of neighbouring cells 401, 402 and 403 generate electric fields that can influence the channel conductivity of the memory cell 400 being read. In this way the surrounding neighbouring cells interfere with and potentially falsify the perceived storage state of the memory cell 400.

One way to mitigate the effects of inter-cell interference (ICI) is to map data values into storage states using a Binary Reflective Gray Label (BRGL).

Figure 5A:
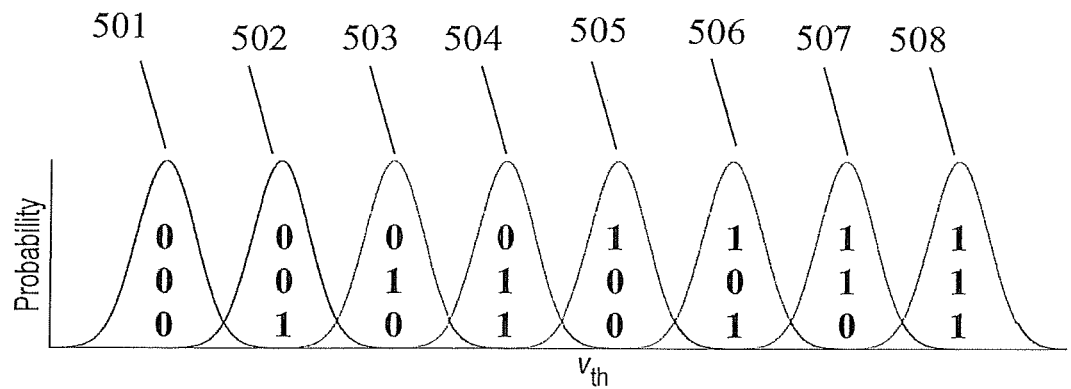
FIG. 5A shows a mapping of storage states in a triple-level cell (TLC) to data values using a natural binary mapping.

FIG. 5A shows a mapping of storage states in a triple-level cell (TLC) to data values using a natural binary mapping. FIG. 5A shows the probability distribution of a first storage state 501. Using a natural binary mapping in the embodiment the first storage state is associated with the data value "000". Likewise the probability distribution of a second storage state 502 is associated with the stored data value "001". This labelling scheme continues for the rest of the storage states in the triple-level cell such that the $N^{th}$ storage state is associated with the natural binary value for the integer N.

While this labelling scheme is conceptually simple it can lead to an increased likelihood of errors in the decoded data. For example consider a situation where a memory cell is programmed to a fourth storage state 504 (storing the data value "011"). In the presence of inter-cell-interference from neighbouring cells it is foreseeable that the threshold voltage at which a memory cell conducts changes. Since interference from neighbouring cells (each with possibly different storage states) is additive it is more probable that the threshold voltage will be altered by a small amount, as oppose to a large amount.

If the inter-cell-interference experienced at the memory cell is large enough the threshold voltage will be shifted such that a memory controller incorrectly decodes the state of the memory cell.

Since the inter-cell interference from the neighbouring cells is additive, the change in threshold voltage will most probably lead to a memory controller perceiving the state of the memory cell to be a neighbouring state of the programmed cell state.

In the case where a memory cell is programmed in the fourth storage state 504 (representing data value "011") then in the presence of inter-cell-interference it may appear that the memory cell is programmed in a fifth state 505 (representing data value "100"). In this case the inter-cell-interference has resulted in the decoded data being incorrect for all three bits, or in other words a 100% bit error rate.

One way to mitigate the effect of inter-cell-interference is to use a Gray coding when mapping data values to the storage states of a flash memory cell. In a Gray code each successive binary value differs by only one bit.

Figure 5B:
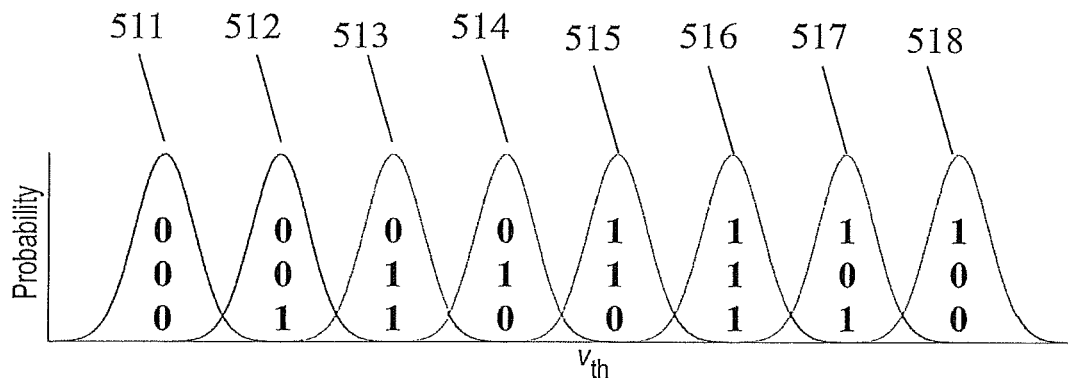
FIG. 5B shows a mapping of storage states in a triple-level cell to data values using a binary reflected Gray labelling.

FIG. 5B shows a mapping of storage states in a triple-level cell to data values using a binary reflected Gray labelling. Like FIG. 5A a probability distribution of a first storage state 511 is associated with the data value "000", a probability distribution of a second storage state is associated with the data value "001" and a probability distribution of a third storage state is associated with the data value "011".

Repeating the example discussed above in relation to FIG. 5A, if the memory cell was programmed to store the data value "011" then the memory cell would be programmed to the third storage state 513. Where the inter-cell-interference experienced by the memory cell is sufficient to cause a shift in threshold voltage, a memory controller could incorrectly determine that the memory cell is programmed in a neighbouring storage state.

In the presence of such inter cell interference, a memory controller would determine that the memory cell is programmed in a fourth storage state 514 (adjacent to the third storage state 513). If this was the case the decoded data would be "010" instead of "011". As will be noted, there is only a single bit error in this case as opposed to the three bit errors present when using natural binary labelling.

By coding data using Binary Reflected Gray Labelling (BRGL) it is possible to mitigate the adverse effects of inter-cell-interference.

While using binary reflected Gray labelling (BRGL) can mitigate the effects of inter-cell-interference, this is at the expense of a disparity in the throughput (i.e. the amount of data which can be correctly read in a set time) of each logical page. Binary reflected Gray labelling (BRGL) enables efficient inter-cell-interference mitigation by multi-step programming however since the number of reads per logical page is different, so is the throughput. For instance, in a multi-level-cell (i.e. a memory cell capable of storing two bits per cell) the logical page corresponding to the MSB only has one hard-decision read reference whereas the logical page corresponding to the LSB has two hard-decision read references. Consequently, the time required to obtain a hard decision value for the LSB is twice the time required to obtain a hard decision value for the MSB.

Additionally, the logical page for the LSB will be the subject of more reading errors, since the possibility of reading errors increases as the number of hard-decision read references increases. Due to both of these factors, the throughput (i.e. the amount of data read correctly for a given time) can vary considerably between the logical pages of a binary reflected Gray labelling (BRGL).

Figure 6:
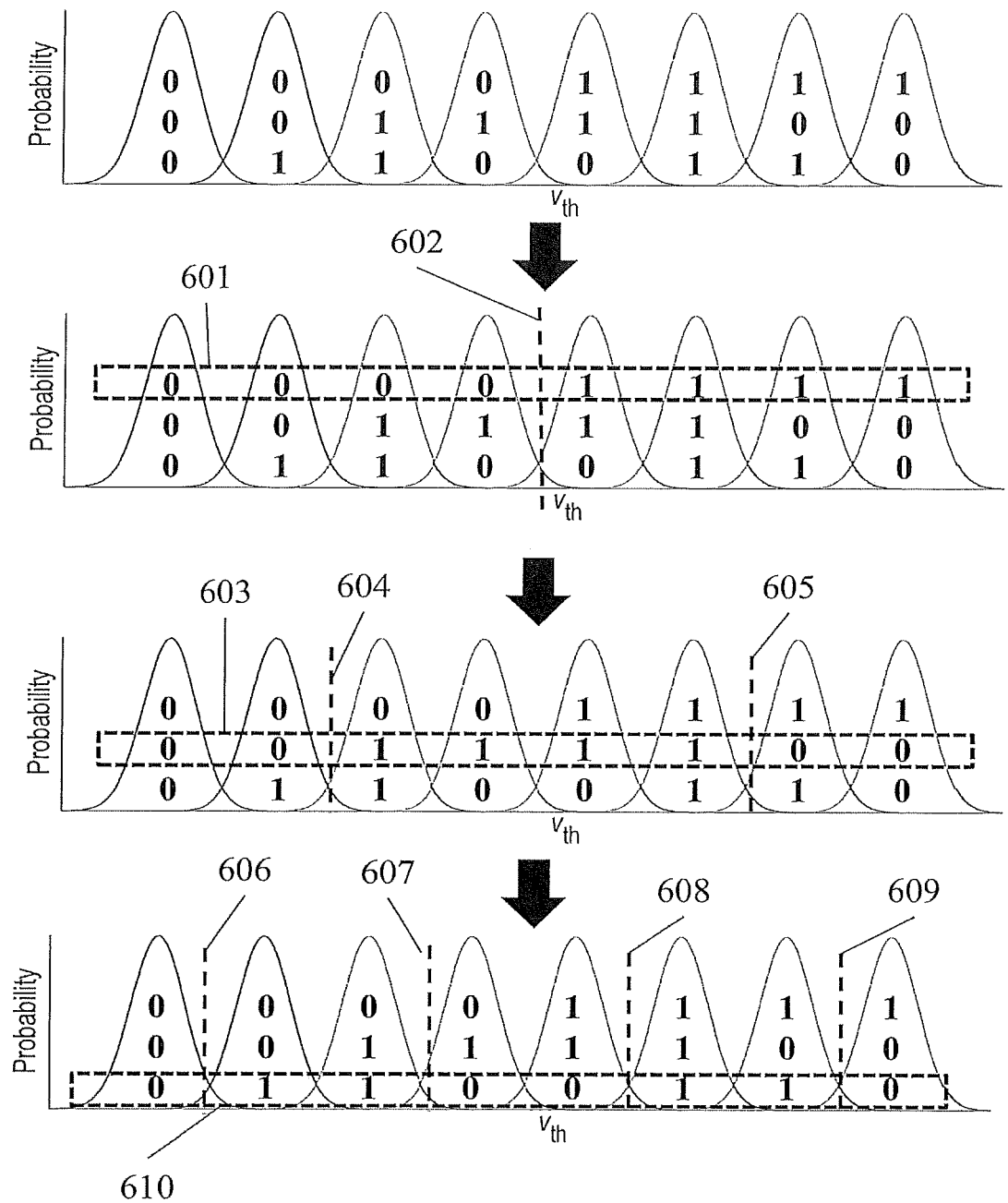
FIG. 6 shows a graphical representation of reading each logical page of a Triple level cell which uses a binary reflective Gray labelling.

FIG. 6 shows a graphical representation of reading each logical page of a Triple level cell which uses a binary reflective Gray labelling. In order to determine the data value stored on a first logical page 601 it is only necessary to perform a single read using a first threshold voltage 602. In order to determine the data value stored on a second logical page 603 it is necessary to read the memory cell twice. Firstly at a second threshold voltage 604, and secondly at a third threshold voltage 605. In order to determine the data value stored on a third logical page 610 it is necessary to read the memory cell using four threshold voltages: a fourth threshold voltage 606, a fifth threshold voltage 607, a sixth threshold voltage 608 and a seventh threshold voltage 609.

In essence, for a TLC memory cell in which data is encoded using binary reflected Gray labelling (BRGL) it is necessary to perform one read of the memory cell to determine the value stored on the first logical page (601), two reads of the memory cell to determine the value stored on the second logical page (603) and four reads of the memory cell to determine the value stored on the third logical page (610). As a result, the throughput of each logical page is different.

One way of reducing the throughput disparity between each logical page is to use a different type of encoding such as a balanced Gray labelling (BGL). In a balanced Gray code each successive binary numeral differs by one bit and the number of bit changes (i.e. "0" to "1" or vice versa) at each bit position (i.e. for the MSB, LSB etc.) are as close as possible to being equal when considered over the whole labelling.

Figure 7:
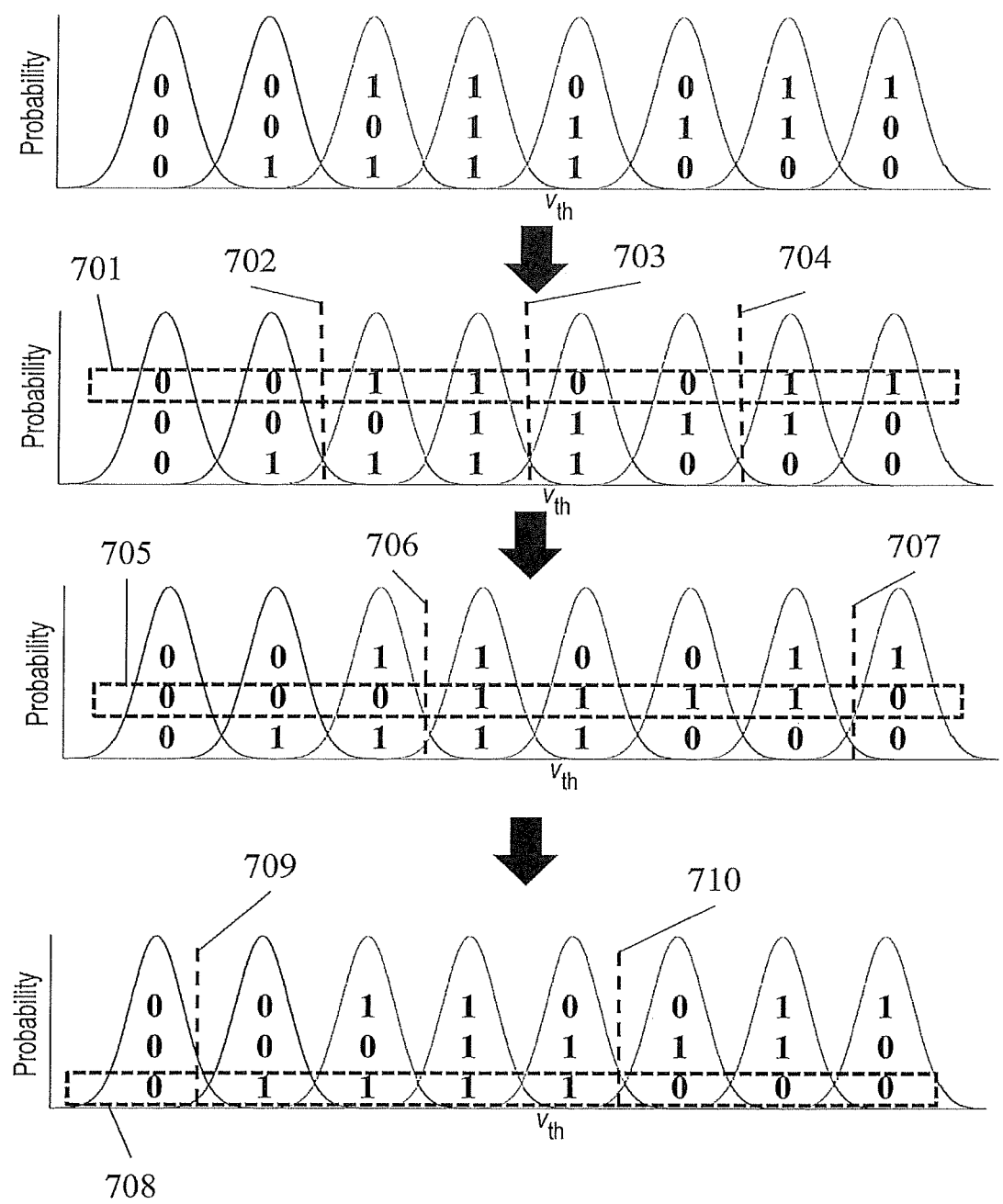
FIG. 7 shows a graphical representation of reading each logical page of a Triple level cell which uses a balanced Gray Labelling.

FIG. 7 shows a graphical representation of reading each logical page of a Triple level cell which uses a balanced Gray Labelling. The balanced Gray labelling used in FIG. 7 is {"000", "001", "101", "111", "011", "010", "110", "100"}. As such, a first state of the memory cell is associated with the stored data value "000", a second state of the memory cell is associated with the stored data value "001", a third state of the memory cell is associated with the stored data value "101" and so on.

In order to determine the value stored on a first logical page 701 it is necessary to read the memory cell using three threshold voltages; a first threshold voltage 702, a second threshold voltage 703 and a third threshold voltage 704. In order to determine the data value stored in a second logical page 705 it is necessary to read the memory cell using two threshold voltages; a fifth threshold voltage 706 and a sixth threshold voltage 707, and in order to determine the data value stored on a third logical page 708 it is necessary to read the memory cell using two threshold voltages; a seventh threshold voltage 709 and an eighth threshold voltage 710.

In essence, for a TLC memory cell in which data is encoded using a balanced Gray labelling the first logical page 701 requires three read operations (702, 703, 704) in order to determine the stored value while the second logical page 705 and third logical page 708 both require two read operations ((706, 707) & (709, 710)) in order to determine the data value stored on each logical page.

As a result of using a balanced Gray labelling the number of reads per logical page is more equal and therefore so is the throughput of each logical page. Furthermore Balanced Gray labelling achieves this without introducing any capacity loss (i.e. there is no overhead associated with using balanced Gray labelling).

While balanced Gray labelling (BGL) is conceptually simple it fails to harness the inherent correlation between adjacent cells (due to inter-cell-interference) to improve the overall the overall performance.

In contrast to single cell modulation where data is mapped to the threshold voltage of a single cell, in multi-cell modulation the data is mapped to the threshold voltage of N cells. In order to determine the data stored on each logical page a memory controller reads the threshold voltages of N cells and maps them back into data. By coding over a plurality of cells the inherent correlation between adjacent cells (due to inter-cell interference) is leveraged to provide superior performance. Coding over a plurality of memory cells means that decoding also has to be performed over a plurality of memory cells. Decoding over a plurality of memory cells inherently makes use of the correlation between cells, as a result performance is improved compared to decoding cell by cell.

Because neighbouring cells are inherently correlated (e.g. through parasitic capacitance) joint detection of neighbouring cells can improve the conveyed information. Instead of basing a decision about the stored data value ($x_i$) of the $i^{th}$ memory cell on the read value ($y_i$) (i.e. $P(x_i|y_i)$) the mappings disclosed herein use other correlated variables, namely the read value of an adjacent memory cell when determining the data value (i.e. $P(x_i|y_i, y_{i+1})$). By using other correlated variables the mappings discloses herein can obtain a better estimate of the stored data value. Furthermore, by careful design paging schemes with improved throughput can be obtained.

FIG. 8 shows a mapping of two logical pages over two Triple-level-cells according to an embodiment. FIG. 8 shows a mapping where the header column 801 lists write voltages of a first cell ($cell_{2i-1}$) and the header row 802 lists write voltages of a second cell ($cell_{2i}$). Each triple-level-cell (i.e. $cell_{2i}$ and $cell_{2i-1}$) has eight possible storage states. As a result there are eight write voltages which are used when programming the triple-level-cells, specifically: $y_e$, $v_2$, $v_3$, $v_4$, $v_5$, $v_6$ and $v_7$.

FIG. 8 also shows two sets of decision boundaries. A first set of decision boundaries (represented by the solid lines) corresponds to the decision boundaries used when determining the data value stored on the first logical page. Similarly, FIG. 8 also shows a second set of decision boundaries (represented by the dashed lines) which represent the decision boundaries used to determine the data value stored on the second logical page.

The first set of decision boundaries comprises: a first first-page boundary 803, a second first-page boundary 804, a third first-page boundary 805, a fourth first-page boundary 806, a fifth first-page boundary 807 and a sixth first page boundary 808. The second set of decision boundaries comprises: a first second-page decision boundary 809, a second second-page decision boundary 810, a third second-page decision boundary 811, a forth second-page decision boundary 812, a fifth second-page decision boundary 813, a sixth second-page decision boundary 814, a seventh second-page decision boundary 815 and an eighth second-page decision boundary 816.

Each decision boundary represents a read voltage for the first and second memory cell respectively. When a memory controller reads a logical page stored across the plurality of cells, the controller applies the voltage represented by the decision boundary. In accordance with the examples described above; upon application of the read voltage the memory controller determines whether the channel current is above a predetermined threshold. If the channel current for the relevant bit-line is above the predetermined threshold, then the memory cell was programmed using any of the write voltages with a lower voltage value than the decision boundary.

For example, if the channel of the second memory cell (i.e. $cell_{2i}$) conducts when a voltage corresponding to the first first-page boundary 803 is applied to the memory cell's gate then the second memory cell (i.e. $cell_{2i}$) was programmed using either a first write voltage $v_e$ or a second write voltage $v_1$.

Correspondingly if the second memory cell (i.e. $cell_{2i}$) fails to conduct when a voltage corresponding to the first first-page boundary 803 is applied to the memory cell's gate then the second memory cell (i.e. $cell_{2i}$) was programmed using a write voltage other than the first write voltage $v_e$ and the second write voltage $v_1$.

In an embodiment the voltages of the decision boundaries (e.g. 803) are equidistant between the write voltages on either side of the decision boundary (e.g. between $v_1$ and $v_2$).

The entries in the mapping of FIG. 8 represent a concatenation of the decimal data value stored on the first logical page 817 and the decimal data value stored on the second logical page 818.

In order to determine the data value stored on the first logical page, in a worst-case scenario it is necessary to perform three read operations (i.e. using read voltages 806, 807 and 808) on the first memory cell, $cell_{2i-1}$ and three read operations (i.e. using read voltages 803, 804 and 805) on the second memory cell, $cell_{2i}$. Only once both the memory cells have been read is it possible to determine the data value stored on the first logical page.

In order to determine the data value stored on the second logical page, in a worst-case scenario it is necessary to perform four read operations (i.e. using read voltages 813, 814, 815 and 816) on the first memory cell, $cell_{2i-1}$ and four read operations (i.e. using read voltages 809, 810, 811 and 812) on the second memory cell, $cell_{2i}$. Only once both the memory cells have been read is it possible to determine the data value stored on the second logical page.

Mapping data values over two adjacent memory cells using the mapping shown in FIG. 8 has a number of desirable characteristics.

Firstly, the mapping shown in FIG. 8 represents a generalised version of a Gray code. This can be seen with reference to a first row of the mapping 819. Taking the value stored on the first logical page 817 which, as discussed above, is determined using the decision boundaries (803, 804 and 805). When traversing across the first row, the decimal value of the first logical page is (0,0,4,4,0,0,4,4), using a binary representation the data value stored on the first logical page is ("000", "000", "100", "100", "000", "000", "100", "100"). When removing repeated entries between decision boundaries this becomes ("000", "100", "000", "100"). This shows, the data values of the first logical page differing by one binary digit each side of a decision boundary.

As can be seen from FIG. 8A, this property is repeated when considering the first-page decision boundaries for the first memory cell, (i.e. the columns of the mapping). This property is also repeated when considering the possible transitions for the data value stored on the second logical page 818.

As previously discussed; using a Gray coding is advantageous since the dominant source of error when reading data from a flash memory is caused by a cell's threshold voltage drifting to an adjacent voltage level as a result of inter-cell-interference. Using a Gray coding reduces the effect of these errors since a drift in the threshold voltage towards an adjacent state only results in a single bit error being introduced in the decoded data.

Another advantageous property of the mapping shown in FIG. 8 is that a similar number of read operations is required in order to determine the data value stored on each logical page.

In order to determine the data value stored on the first logical page it is, in a worst-case scenario, necessary to perform three read operations on each memory cell. Likewise in order to read the data value stored on the second logical page it is, in a worst-case scenario, necessary to perform four read operations on each memory cell. Since the first logical page has three read operations and the second logical page has four read operations the amount of raw bit-error rate (i.e. the error rate of data read from the memory cells before error correction) is the same. By designing the multi-page modulation scheme such that the number of reads per logical page is substantially the same, the multi-page modulation discloses herein has the desirable property that the raw bit-error-rate per logical page is substantially similar.

Furthermore, although FIG. 8 shows a mapping for both of the logical pages, it is possible to read logical pages independently. In this way the data value stored on the first logical page can be determined by reading both memory cells using only the decision boundaries associated with the first logical page (i.e. without using any of the decision boundaries associated with the second logical page (e.g. 809, 810, 811, 812, 813, 814, 815 and 816)).

Additionally, the mapping discussed above does not need be generated each time data is to be written or read from the flash memory. Instead the mapping shown in FIG. 8 can be precomputed and stored in the memory 160 for use by the memory controller 120 during the reading and writing process.

FIG. 9 shows a multi-cell mapping from decimal data values to memory cell write voltages according to an embodiment. FIG. 9 shows the dual of the demodulation table shown in FIG. 8. Consequently, when the input data is mapped (or modulated) into write voltages using the mapping shown in FIG. 9 it can be decoded (or demodulated) using the mapping of FIG. 8 and return the input data values.

In FIG. 9 the decimal data value to be written to a first page ($M_1$) is represented by a header column 901 and the decimal data value to be written to a second page ($M_2$) is represented by the header row 902. The mapping comprises a plurality of entries wherein each entry comprises two write voltages. For example a first entry 903 comprises the mapping ($v_5$, $v_7$); where the first write voltage 904 ($v_5$) is the write voltage used to program the first memory cell (i.e. $cell_{2i-1}$) and the second threshold voltage 905 ($v_7$) is the write voltage which is used when programming the second memory cell (i.e. $cell_{2i}$).

Figure 10:
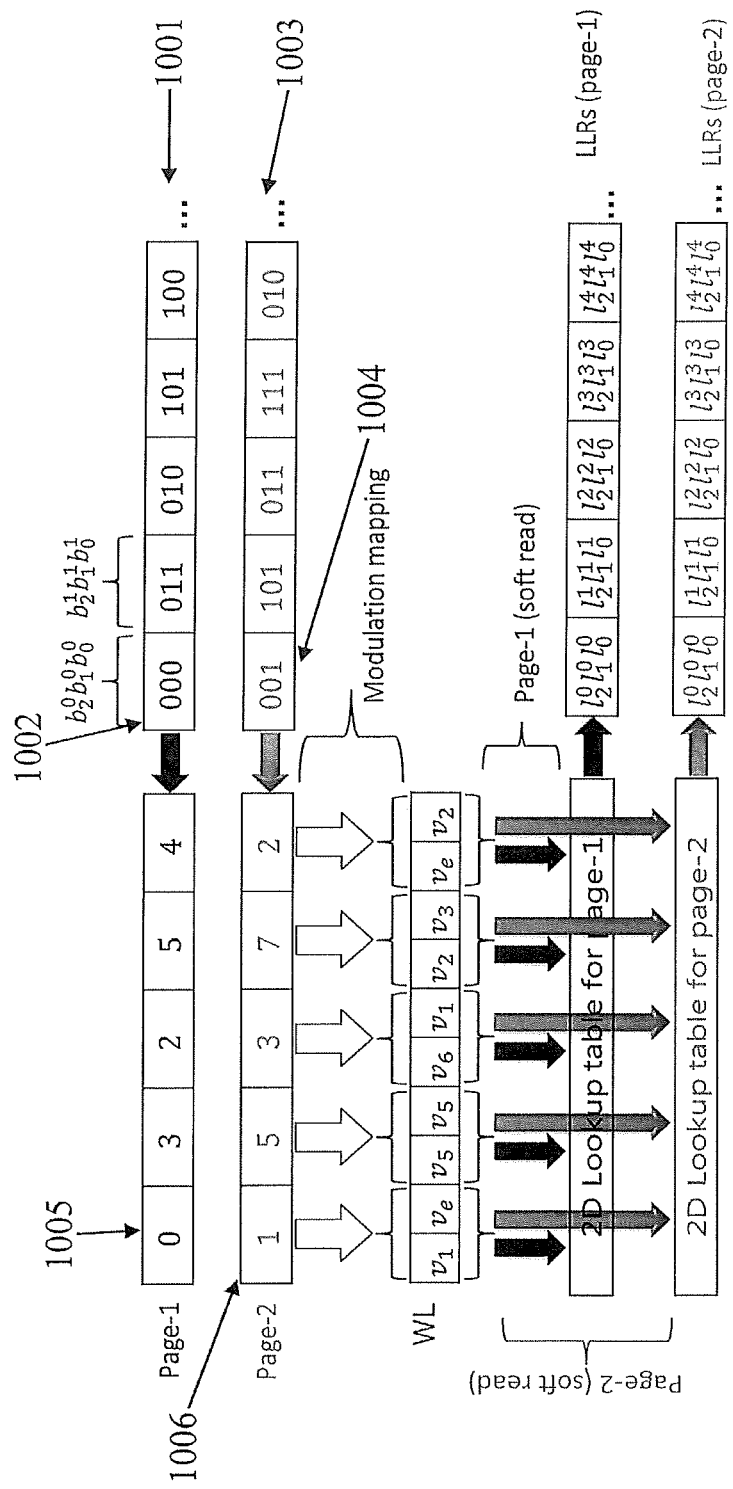
FIG. 10 shows a graphical illustration of multi-cell modulation according to an embodiment.

FIG. 10 shows a graphical illustration of multi-cell modulation according to an embodiment. FIG. 10 shows two data streams which are to be stored on two logical pages. More specifically, FIG. 10 shows a first data stream 1001 comprising a first binary value 1002 and a second data stream 1003 comprising a second binary value 1004.

During multi-cell modulation the first binary value 1002 is converted by the memory controller 120 into a first decimal value 1005. Similarly, the second binary value 1004 is converted by the memory controller 120 into a second decimal value 1006.

Once a decimal data value for each logical page has been determined the method determines the write voltages for each memory cell of the plurality of memory cells spanned by the logical pages.

Optionally, a conversion between a binary data value and a decimal data value is not required and instead the binary data value is used to identify write voltages in the mapping.

In FIG. 10 data is modulated onto two logical pages of two adjacent triple-level cells. In order to determine the write voltages for each memory cell (i.e. $cell_{2i-1}$ and $cell_{2i}$) a mapping which generates a write voltage for each memory cell based on the data value to be written to each logical page is required. In FIG. 10 the mapping shown in FIG. 9 is used for this purpose. In an embodiment the mapping is stored using a lookup table in a memory of the memory controller.

In FIG. 10, the first data stream 1001 represents the data values to be stored on the first logical page $M_1$ in FIG. 9, while the second data stream 1003 represents the data values to be stored on the second logical page $M_2$ in FIG. 9.

For example, when the first decimal value 1005 equals "0" and the second decimal value equals "1" then, on reference to the modulation mapping in FIG. 9, it is determined that write voltages are ($v_1$, $v_e$), where the write voltage for the first memory cell, $cell_{2i-1}$, is $v_1$ and the write voltage for the second memory cell, $cell_{2i}$, is $y_e$. The determined write voltages are subsequently used when the memory controller programs the plurality of memory cells.

A similar process is also used when reading the plurality of adjacent memory cells. In order to determine the value stored on each logical page it is necessary to determine which write voltages (i.e. $v_e$, $v_1$, $v_2$, $v_3$, $v_4$, $v_5$, $v_6$ or $v_7$) was used to program each of the adjacent memory cells. As discussed above, this is achieved by determining the level of conduction for each memory cell using the plurality of decision boundaries.

After determining the write voltages used to program each adjacent memory cell, the memory controller 140 uses a demodulation mapping to determine the data values which correspond to these write voltages. In the example of FIG. 10 this step is achieved using the mapping shown in FIG. 8.

In FIG. 8 the entry located at a row corresponding to the first memory cell write voltage and a column corresponding to the second memory cell write voltage describes the data value stored on each logical page. For example, the entry corresponding to the row $v_1$ and column $v_e$ is '01'; where the first number represents the data value stored on the first logical page (i.e. decimal number '0') and the second number represents the data value stored on the second logical page (i.e. decimal number '1').

Although in the example discussed above both logical pages are read at the same time it is emphasized that the data value stored on each logical page could be determined separately by reading each adjacent cell using a subset of the possible decision boundaries.

The demodulation process described above is an example of a hard decision decoding where the value of a memory cell determined from the reading process only takes one value from the set of possible stored data values.

In an embodiment soft decision data is generated as oppose to hard decision data when reading the memory cells during the demodulation process.

Unlike hard decision decoding where a stored data value is selected from the set of possible stored values, in soft decision decoding the threshold voltage is used to generate a measure of the reliability (i.e. a probability), that the memory cell is storing a certain value. This soft information can subsequently be used along with an error correcting code to robustly prevent erroneous determination of the stored data. One example of soft information is a log-likelihood ratio (LLR) value.

Error correction codes to which soft decoding can be applied include a LDPC (low-density parity check) code, a BCH code, a turbo code, an RS (Reed-Solomon code), a convolution code, an RSC (Recursive Systematic Code), or coded modulation such as TCM (Trellis-Coded Modulation), BCM (Block Coded Modulation), and so on. These error correction codes are often used in conjunction with a soft-decision decoding algorithm (also known as a soft deciding algorithm). These soft deciding algorithms can include, amongst others, mini-sum algorithms and Viterbi decoding.

In an embodiment, the plurality of decision boundaries comprises a set of hard decision boundaries (as previously shown in FIG. 8) and a set of soft decision boundaries for each of the hard decision boundaries. The process of generating soft decision information from a hard boundaries, surrounded by a plurality of soft boundaries is known in the art and is omitted for brevity however using these techniques it is possible to generate soft decision information for the data value stored on each logical page as shown in FIG. 10.

As an example, if soft decision decoding was implemented with one soft decision boundary either side of the hard decision boundary, then there would be four possible voltage bins (i.e. below the lower soft decision threshold, between the lower soft decision threshold and the hard decision threshold, between the hard decision threshold and the higher soft decision threshold and above the higher soft decision threshold). When reading a single cell the resulting soft decision information (e.g. the LLR value) will depend on which voltage bin the memory cell conducts in.

Since two adjacent memory cells are used to store a logical page in the mapping described above the reading process is two dimensional. As a result, in the example discussed above there would be 16 possible LLR values for each combination of first cell and second cell hard decision boundary (i.e. a 4×4 square would be formed at the intersection of the hard decision boundaries with a different LLR value for each 1×1 square).

Figure 11A:
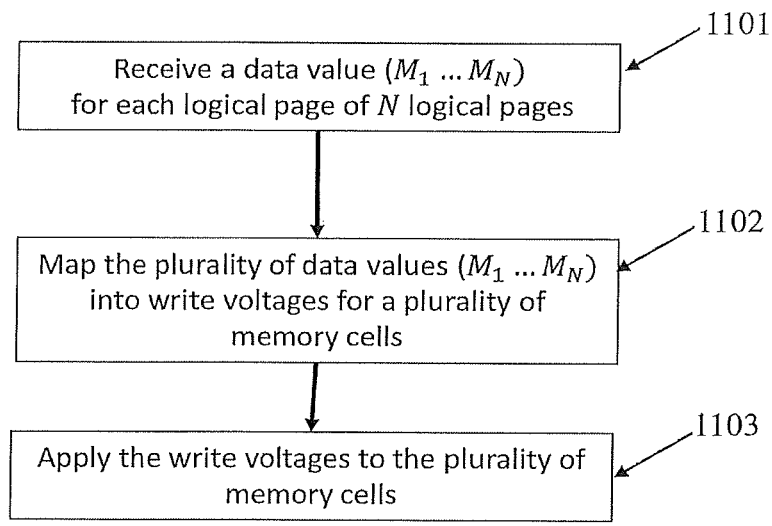
FIG. 11A shows a method of performing multi-cell modulation according to an embodiment.

FIG. 11A shows a method of performing multi-cell modulation according to an embodiment. Although the following methods will be described with reference to the system shown in FIG. 1 it is emphasized that the methods described below could also be implemented in other memory systems.

The method begins in step 1101 by the control unit 140 of the memory controller 120 receiving a data value to be stored on each logical page in a multi-cell modulation which uses N logical pages. In an embodiment the data values are received from the computing device 100.

In step 1102 the control unit 140 maps the plurality of data values received in step 1101 into a write voltage for each memory cell of the plurality of memory cells. In an embodiment the control unit 140 uses a look-up table stored in the memory 160 to perform this mapping. In a further embodiment the mapping shown in FIG. 8 is used by the control unit 140.

In step 1103 the control unit 140 programs a plurality of adjacent cells in the non-volatile flash memory 130 using the write voltages determined in step 1102.

In the method described above a single mapping is used when modulating data values of multiple adjacent memory cells.

In a further embodiment the memory 160 stores a plurality of different mappings and the control unit 140 is configured to select a mapping from the plurality of mapping depending on a number of factors including, but not limited to, error performance, the characteristics of the non-volatile memory 130 or the type of the non-volatile memory 130. Additionally the control unit 140 could be configured to change the selected mapping as the memory cells age, get worn out and/or operate at different temperatures. In this way the methods and systems disclosed herein enable a flexible paging scheme where the modulation (and demodulation) scheme can change on-the-fly for different sections of the flash memory 130.

Figure 11B:
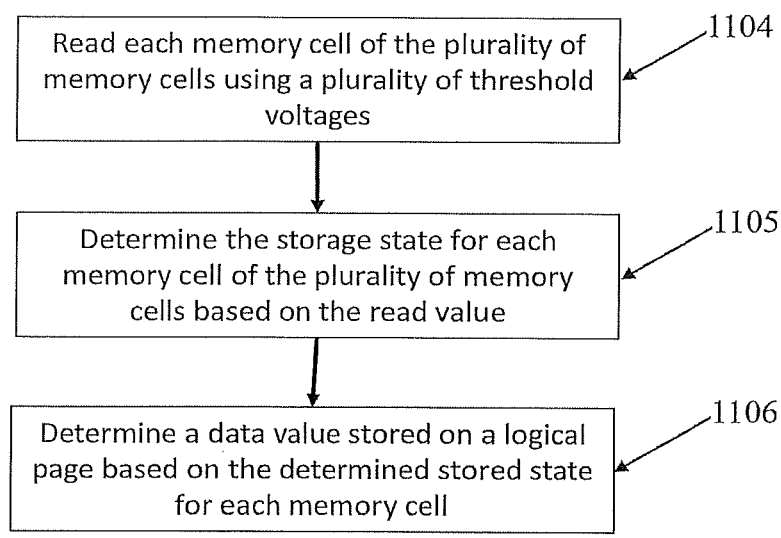
FIG. 11B shows a method of performing multi-level demodulation according to an embodiment.

FIG. 11B shows a method of performing multi-level demodulation according to an embodiment. Although the following methods will be described with reference to the system shown in FIG. 1 it is emphasized that the methods described below could also be implemented in other systems.

The method begins in step 1104 by control unit 140 reading the plurality of memory cells which are spanned by a logical page using a plurality of threshold voltages. As discussed above, the plurality of threshold voltages used when reading each memory cell are dictated by the mapping being used.

In one embodiment the plurality of threshold voltages comprises a threshold voltage for each instance the data value stored on a logical page changes. In a further embodiment the value of the threshold voltage (or decision boundary) equals a voltage between the write voltages of the two adjacent states where the data value stored on the logical page changes.

In step 1105 the control unit 140 determines the write voltage applied to the memory cell during the modulation process using the plurality of threshold voltages (or decision boundaries) generated in step 1104. For each threshold voltage the control unit 140 receives an indication of whether the memory cell conducts. In this way it is possible for the control unit 140 to determine which storage state (or states) the memory cell was programmed to.

In step 1106 the control unit 140 determines the data value stored on a logical page based on the threshold voltage for each memory cell of the plurality of memory cells. In order to determine the data value stored on a logical page the control unit 140 uses a demodulation table, such as that shown in FIG. 9. In an embodiment the demodulation mapping is stored in the memory 160 and accessed by the control unit 140.

In a further embodiment the memory 160 comprises a plurality of demodulation mappings and the control unit 140 is configured to select a demodulation mapping from the plurality of demodulation mappings based on the modulation mapping used when programming the plurality of memory cells which are now being read.

Although in the examples discussed above, only a single modulation (and corresponding demodulation) mapping was used, it is emphasized that other demodulation mappings could also be used which share the same properties as the mapping shown in FIG. 8 and FIG. 9. Namely, encoding a data value in a logical page which is stored over a plurality of cells wherein the mapping represents a generalised Gray coding.

Figure 12:
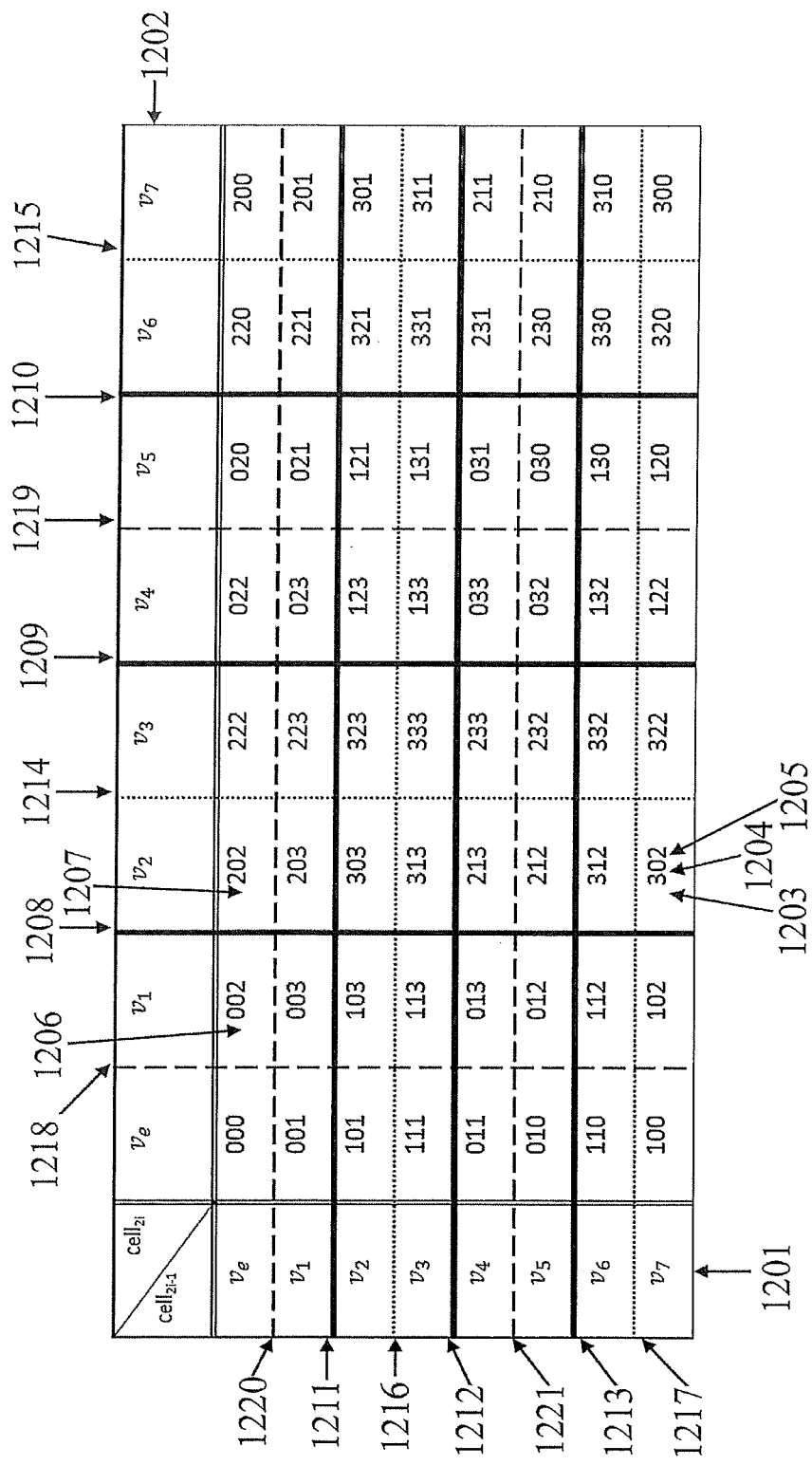
FIG. 12 shows a demodulation mapping where three logical pages are written over two triple level cells.

FIG. 12 shows a demodulation mapping where three logical pages are written over two triple level cells. FIG. 12 shows a mapping for two triple-level cells, as a result a header column 1201 and a header row 1202 comprise eight different write voltages ($v_e$, $v_1$, $v_2$, $v_3$, $v_4$, $v_5$, $v_6$ and $v_7$) representing the eight different storage states of the first memory cell and the second memory cell $cell_{2i}$ respectively.

FIG. 12 shows a mapping where data is stored on three logical pages. Each entry in the demodulation table comprises three numbers concatenated together. A first number 1203 represents a decimal data value written to a first logical page, a second number 1204 represents the decimal value written to a second logical page and a third number 1205 represents the decimal value written to a third logical page.

Since there are three logical pages in the example of FIG. 12 and each memory cell (i.e. $cell_{2i}$ and $cell_{2i-1}$) is capable of storing 3 bits (i.e. 8 storage states); each logical page stores 1 bit/cell. Taken over two cells, each logical page stores 2 bits representing the decimal values 0, 1, 2, 3 as shown in the entries of FIG. 12.

The demodulation mapping shown in FIG. 12 is a Gray code since adjacent data values differ by only one bit. For example, consider a first entry 1206 corresponding to the decimal data value "002" and a second entry 1207 corresponding to the decimal data value "202". Between the first entry 1206 and the second entry 1207 the decimal value for the first page changes from "0" to "2", or in binary "00" to "10". All other pages remain unchanged. In this way the mapping shown in FIG. 11 is a Gray code since the adjacent data values only differ by one bit.

Furthermore the mapping shown in FIG. 12 represents a balanced Gray code. As previously discussed, in a balanced Gray code the transition count (i.e. the number of times a bit transitions between states) for each logical page is as close as possible to being equal, and in any case within two counts of each other for any arbitrary bit position.

FIG. 12 shows a set of first-page decision boundaries comprising a first first-page decision boundary 1208, a second first-page decision boundary 1209, a third first-page decision boundary 1210, a fourth first-page decision boundary 1211, a fifth first-page decision boundary 1212 and a sixth first-page decision boundary. The set of first-page decision boundaries are used when determining the data value stored on the first logical page represented by the first decimal number in the entries of the mapping (e.g. 1203).

FIG. 12 also shows a set of second-page decision boundaries comprising a first second-page decision boundary 1214, a second second-page decision boundary 1215, a third second-page decision boundary 1216, a fourth second-page decision boundary 1217. The set of second-page decision boundaries are used to determine the data value stored on the second logical page represented by the second decimal number in the entries of the mapping (e.g. 1204).

FIG. 12 also shows a set of third-page decision boundaries comprising a first third-page decision boundary 1218, a second third-page decision boundary 1219, a third third-page decision boundary 1220, a fourth third-page decision boundary 1221. The set of third-page decision boundaries are used to determine the data value stored on the third logical page represented by the third decimal number in the entries of the mapping (e.g. 1205).

In essence, the mapping shown in FIG. 12 requires 2 read operations per memory cell to read the first logical page, 2 read operations per memory cell to read the second logical page and 3 read operations per memory cell to read the third logical page. Since the number of read operations required per logical page at most differs by one read, the mapping shown in FIG. 12 is a balanced Gray coding.

The corresponding modulation table used to encode data is the dual of the demodulation mapping shown in FIG. 12.

FIG. 13 shows a demodulation mapping of two logical pages written over two quadruple level cells. Since the memory cells are quadruple level cells there are 16 possible storage states and correspondingly there are 16 different write voltages. Each entry comprises a first decimal number and a second decimal number separated by a comma. The first decimal number corresponds to the data value stored on the first logical page while the second decimal number corresponds to the data value stored on the second logical page. Each logical page has a plurality of decision boundaries. The set of decision boundaries associated with the first logical page are marked using solid lines and the set of decision boundaries associated with the second logical page are marked using dashed lines.

Since there are two logical pages in the example of FIG. 13 and each memory cell (i.e. $cell_{2i}$ and $cell_{2i-1}$) is capable of storing 4 bits (i.e. 16 storage states); each logical page stores 2 bit/cell. Taken over two cells, each logical page stores 4 bits.

In accordance with the other mappings presented above, the mapping shown in FIG. 13 represents a balanced grey coding where data is encoded over a plurality of adjacent cells.

FIG. 14 shows a part of a demodulation mapping of three logical pages written over three quadruple level cells. Since the memory cells are quadruple level cells there are 16 possible storage states and correspondingly there are 16 different write voltages. As a result each logical page stores 4/3 bits per cell. Furthermore since the logical pages are mapped across three memory cells, the complete demodulation mapping is three dimensional.

For simplicity, FIG. 14 only shows a demodulation mapping for a second and a third memory cell (i.e. $cell_{3i-1}$ and $cell_{3i}$) where the value of a first memory cell (i.e. $cell_{3i-2}$) is $v_e$ however demodulation mappings corresponding to other values for the first memory cell could be generated by replicating the decision boundaries used in FIG. 14 in the third dimension and assigning data values for each logical page based on a Gray coding.

In FIG. 14 the entries comprise a first decimal number corresponding to the data value stored on the first logical page, a second decimal number corresponding to the data value stored on the second logical page and a third decimal number corresponding to the data value stored on the third logical page. Like the examples above, a first set of decision boundaries which are used for determining the data value stored on the first logical page are shown in solid black lines, a second set of decision boundaries used to determine the data value stored on the second logical page are marked with fine dashed lines (or dots) and a third set of decision boundaries which are used to determine the data value stored on the third logical page are marked with thick dashed lines (or dashes).

Figure 15:
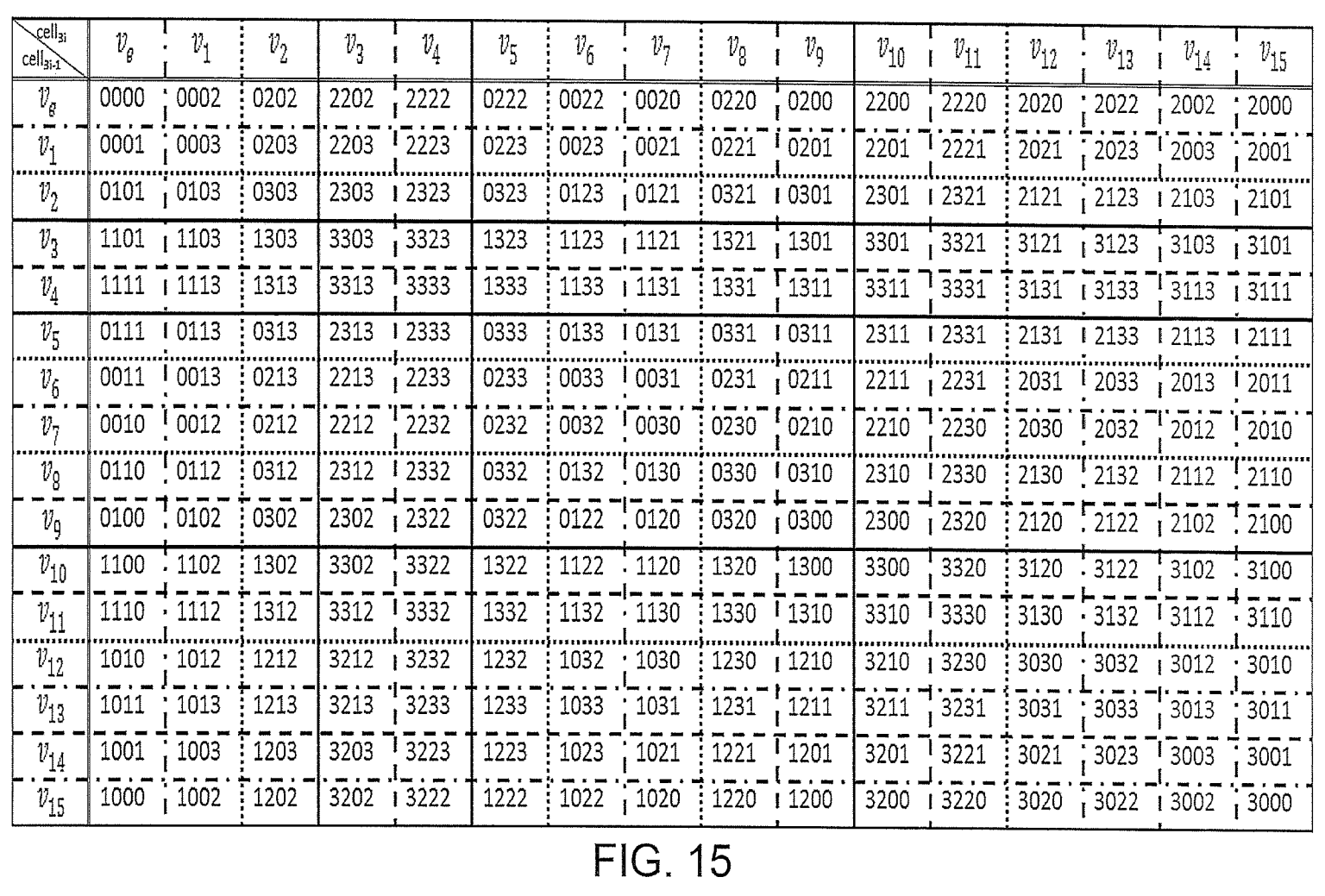

FIG. 15 shows a part of a demodulation mapping of four logical pages written over three quadruple level cells. Since the logical pages are mapped across three memory cells, the complete demodulation mapping is three dimensional. For simplicity, FIG. 15 only shows a demodulation mapping for a second and a third memory cell (i.e. cell$_{3i-1}$ and cell$_{3i}$) where the value of a first memory cell (i.e. cell$_{3i-2}$) is v$_e$ however demodulation mappings corresponding to other values for the first memory cell could be generated by replicating the decision boundaries present in FIG. 15 in the third dimension and assigning data values for each logical page in accordance with a Gray coding.

Since there are four logical pages and each memory cell (i.e. cell$_{3i}$, cell$_{3i-1}$ and cell$_{3i-2}$) is capable of storing 4 bits (i.e. 16 storage states); each logical page stores 1 bit/cell. Taken over three cells, each logical page stores 3 bits.

In FIG. 15 the entries comprise: a first decimal number corresponding to the data value stored on the first logical page, a second decimal number corresponding to the data value stored on the second logical page, a third decimal number corresponding to the data value stored on the third logical page and a fourth decimal number corresponding to the data value stored on the fourth logical page.

Like the examples above, a first set of decision boundaries which are used for determining the data value stored on the first logical page are shown in solid black lines, a second set of decision boundaries used to determine the data value stored on the second logical page are marked with fine dashed lines (or dots), a third set of decision boundaries which are used to determine the data value stored on the third logical page are marked with thick dashed lines (or dashes) and a fourth set of decision boundaries which are used to determine the data value stored on the fourth logical page are marked with lines comprising dots and dashes.

A number of the mappings presented above were simulated using the flash memory channel used in G. Dong, N. Xie and T. Zhang, "Enabling NAND Flash Memory Use Soft-Decision Error Correction Codes at Minimal Read Latency Overhead," in IEEE Transactions on Circuits and Systems I: Regular Papers, vol. 60, no. 9, pp. 2412-2421, Sep. 2013, which is incorporated herein by reference.

In the following simulations the threshold voltages for Triple Level Cells (TLC) were {1.1V, 2.35V, 2.7V, 3.05V, 3.4V, 3.75V, 4.15V, 4.5V}. The Triple Level Cells (TLC) were programmed using an iterative approach known as incremental step pulse programming (ISPP) where multiple cells are programmed concurrently in small steps. Accordingly, in the following simulations an incremental step pulse programming (ISPP) value of 0.2V was used to program the cells.

The threshold voltages for Quad Level Cells (QLC) were {1.1V, 2.35V, 2.5V, 2.65V, 2.8V, 2.95V, 3.1V, 3.25V, 3.4V, 3.55V, 3.7V, 3.85V, 4, 4.15V, 4.3V, 4.45V}. The incremental step pulse programming (ISPP) value used to program these cells was 0.1V.

The following simulations also used an (4608, 4096) Low-density parity-check code (LDPC) code to encode the data and a Look-up-table (LUT) was used to map information obtained by reading adjacent memory cells into soft decision information for use by the iterative decoder.

Figure 16A:
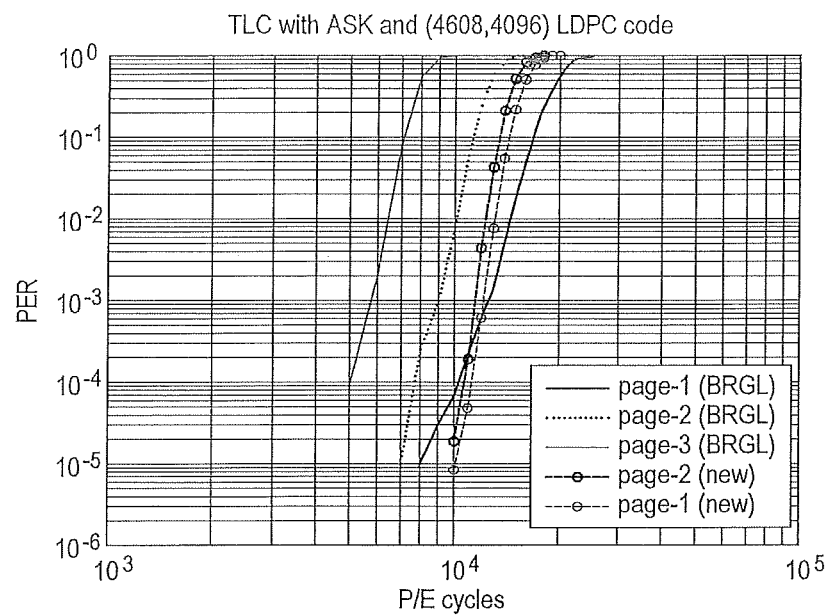
FIG. 16A shows the Packet-error rate (PER) for the mapping shown in FIG. 8 where two logical pages are modulated over two Triple-level-cells.

FIG. 16A shows the Packet-error rate (PER) for the mapping shown in FIG. 8 where two logical pages are modulated over two Triple-level-cells. FIG. 16A shows the Packet-error rate (PER) for each logical page of the mapping shown in FIG. 8 compared to the Packet-error rate (PER) for each logical page when encoding data using Binary Reflective Gray Labelling (BRGL). FIG. 16A shows the mapping of FIG. 8 achieves, on the whole, a performance improvement with respect to BRGL. More specifically, FIG. 16A shows that for the same number of program-erasure cycles (i.e. a sequence where data is written to flash memory cell, then erased, and then rewritten) the mapping presented herein is more reliable than at least the second and third pages of a memory cell which uses binary reflective Gray Labelling (BRGL) to store data. FIG. 16A also shows how each logical page of the mapping disclosed in FIG. 8 performs similarly.

Figure 16B:
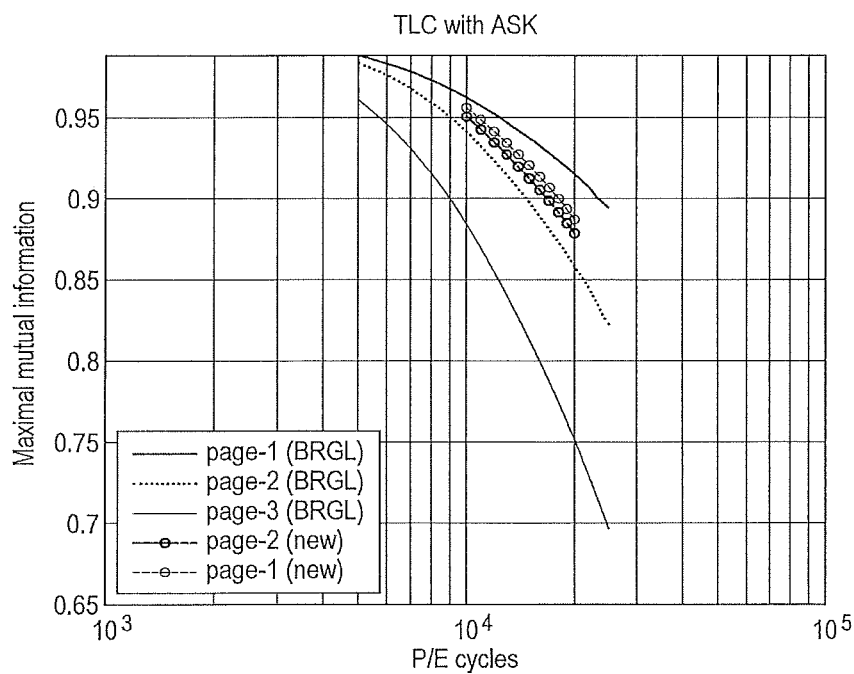
FIG. 16B shows the conveyed mutual information for the mapping shown in FIG. 8 where two logical pages are modulated over two Triple-level-cells.

FIG. 16B shows the conveyed mutual information for the mapping shown in FIG. 8 where two logical pages are modulated over two Triple-level-cells.

The Mutual Information between two variables is a measure of their mutual dependence. Consequently, by increasing the Mutual Information between the input state and the determined storage state of the memory cell it is possible to more accurate decode data.

FIG. 16B shows how both logical pages convey more mutual information for a given number of program-erasure cycles than readings from the second and third logical pages of a memory cell where data is modulated using a binary reflective Gray labelling (BRGL). FIG. 16B also shows how each logical page of the mapping shown in FIG. 8 performs similarly.

Figure 17A:
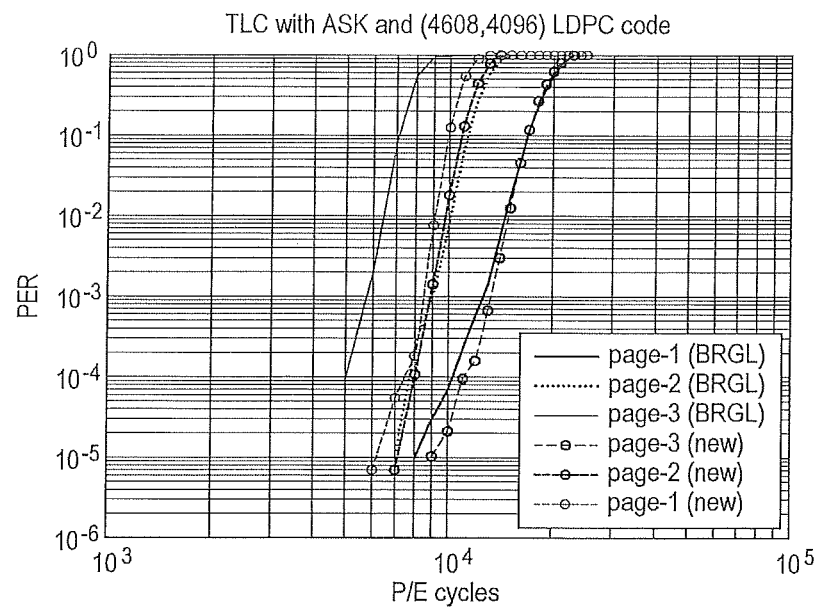
FIG. 17A shows the Packet-error rate (PER) for the mapping shown in FIG. 12 where three logical pages are modulated over two Triple-level-cells.

FIG. 17A shows the Packet-error rate (PER) for the mapping shown in FIG. 12 where three logical pages are modulated over two Triple-level-cells. FIG. 17A shows the Packet-error rate (PER) for each logical page of the mapping shown in FIG. 12 compared to the Packet-error rate (PER) for each logical page when using Binary Reflective Gray Labelling (BRGL). FIG. 17A shows the mapping disclosed in FIG. 12 achieves, on the whole, a performance improvement with respect to BRGL. FIG. 17A also shows two of the logical pages of the mapping disclosed in FIG. 12 performing similarly, with all three logical pages having a more similar Packet-error rate (PER) than the logical pages of a memory cell which uses binary reflective Gray Labelling (BRGL) to store data.

Figure 17B:
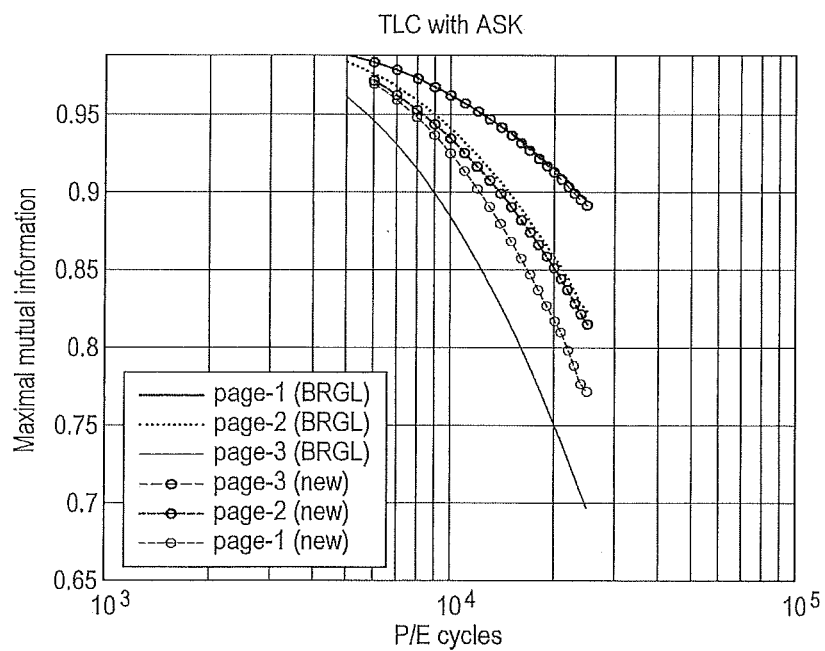
FIG. 17B shows the conveyed mutual information for the mapping of two logical pages over two Triple-level-cells shown in FIG. 12.

FIG. 17B shows the conveyed mutual information for the mapping of two logical pages over two Triple-level-cells shown in FIG. 12. Similarly to FIG. 17A, FIG. 17B shows on average that the mapping shown in FIG. 12 conveys more mutual information than modulating data using a Binary Reflective Gray Labelling (BRGL).

Figure 18A:
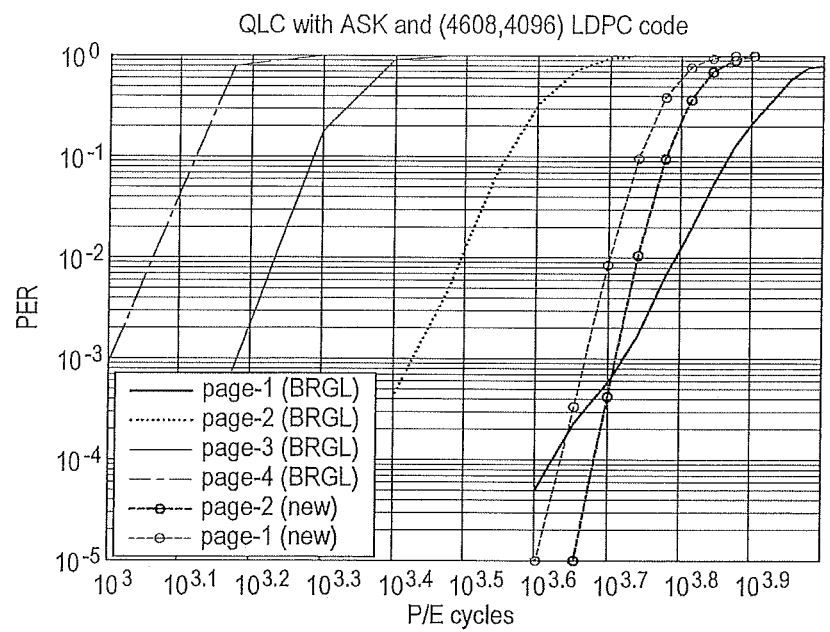
FIG. 18A shows the Packet-error rate (PER) for the mapping shown in FIG. 13 where two logical pages are modulated over two Quad-level-cells.

FIG. 18A shows the Packet-error rate (PER) for the mapping shown in FIG. 13 where two logical pages are modulated over two Quad-level-cells. FIG. 18A shows the Packet-error rate (PER) for each logical page of the mapping shown in FIG. 13 compared to the Packet-error rate (PER) for each logical page when using Binary Reflective Gray Labelling (BRGL). FIG. 18A shows the mapping disclosed in FIG. 13 achieves, on the whole, a performance improvement with respect to BRGL. FIG. 18A also shows the two logical pages of the mapping disclosed in FIG. 13 performing similarly, both with a Packet-error rate (PER) which is better than the Packet-error rate (PER) for three out of four logical pages of a memory cell which uses binary reflective Gray Labelling (BRGL) to store data.

Figure 18B:
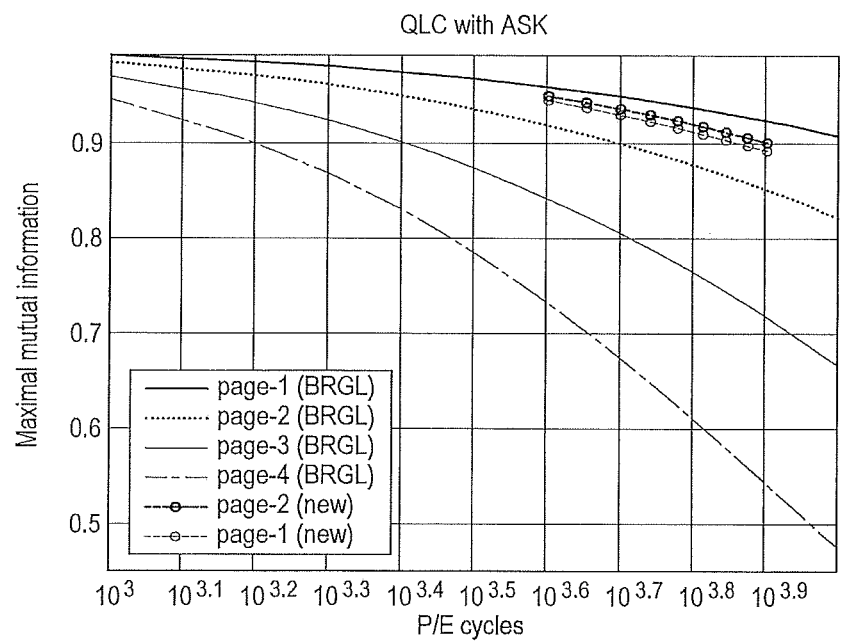
FIG. 18B shows the conveyed mutual information for the mapping of two logical pages over two Quadruple-level-cells shown in FIG. 13.

FIG. 18B shows the conveyed mutual information for the mapping of two logical pages over two Quadruple-level-cells shown in FIG. 13. Similarly to FIG. 18A, FIG. 18B shows that the conveyed mutual information using the mapping of FIG. 13 is higher than three out of four of the logical pages when modulating data using a Binary Reflective Gray Labelling (BRGL).

FIG. 19 shows a generalised mapping of two logical pages over two Triple-level-cells according to an embodiment. FIG. 19 shows a generalised form of the mapping shown in FIG. 8. In keeping with the mapping shown in FIG. 8, FIG.

19 comprises a first set of decision boundaries (represented by the solid lines) corresponding to the decision boundaries used to determine the data value stored on the first logical page. Likewise, FIG. 19 also shows a second set of decision boundaries (represented by the dashed lines) which represent the decision boundaries used to determine the data value stored on the second logical page.

Given that FIG. 19 represents a generalised form of FIG. 8, a detailed discussion will be omitted for brevity. However, unlike in FIG. 8 where each entry in the mapping is assigned a fixed data value in FIG. 19 the entries are associated with a variable which could correspond to any data value, provided the rules of the mapping are met (i.e. the mapping for each logical page represents a Gray code). In FIG. 19 each logical page (i.e. the first logical page, $P_0$, and the second logical page $P_1$) can take 8 possible values (i.e. A, B, C, D, E, F, G). Each entry in the generalised mapping of FIG. 19 is of the form $P_X^Y$ where X is the number of the logical page and Y is the storage state of the logical page. Optionally, the data value corresponding to the storage state of the logical page is described by a further mapping.

FIG. 20 shows a generalised mapping for a first logical page over two Triple-level-cells according to an embodiment. FIG. 20 shows the mapping of write voltages to storage states used in FIG. 19, but only for the first logical page, $P_0$. FIG. 20 also shows a mapping of storage states to data values.

For example, taking the first logical page, $P_0$, as shown in FIG. 20, the mapping 2000 requires that the data value associated with the 'A' storage state differs by only one binary digit with respect to the data value associated with the 'B' storage state and the 'E' storage state. As can be seen, this requirement is met by a first value mapping 2001 where 'A' is associated with '000', 'B' is associated with '001' and 'E' is associated with '100'. There are also a plurality of other value mappings (2002, 2003, 2004) shown in FIG. 20 which also meet this criteria.

FIG. 20 shows four possible mappings from storage states to data values however for the avoidance of doubt it is emphasized that any number of possible mappings could be used provided the mapping for each logical page represents a Gray code.

Although FIG. 20 only shows the mapping 2000 for the first logical page it is emphasised that the value mappings (2001, 2002, 2003, 2004) could also be used for the second logical page (i.e. $P_1$). In an embodiment the first logical page (i.e. $P_0$) and the second logical phage (i.e. $P_1$) use the same value mapping. In a different embodiment the first logical page (i.e. $P_0$) and the second logical phage (i.e. $P_1$) use a different value mapping.

FIG. 21 shows a generalised demodulation mapping where three logical pages are written over two triple level cells. FIG. 21 shows a generalised version of the mapping shown in FIG. 12. Since three logical pages are mapped over two triple level cells, each logical page can store two bits of information. As a result the possible storage states of for each logical page (i.e. the first logical page, $P_0$, the second logical page, $P_1$, and the third logical page $P_2$) are {'A', 'B', 'C', 'D'}.

FIG. 22 shows a plurality of value mapping which could be used for a logical page of the mapping shown in FIG. 21. FIG. 22 shows a plurality of mappings which each result in the demodulation mapping of FIG. 21 representing a Gray code. Since the data values stored on each logical page are independent, the same or different value mappings can be used for each logical page. Although only three value mappings are shown in FIG. 22 it is emphasized that any value mapping of data values to states of the logical page could be used provided that the modulation and demodulation mappings result in a Gray code.

FIG. 23 shows a generalised demodulation mapping of two logical pages written over two quadruple level cells. FIG. 23 shows a generalised version of the demodulation mapping shown in FIG. 13. In FIG. 23 the possible storage states for each logical page are {'A', 'B', 'C', 'D', 'E', 'F', 'G', 'H', 'I', 'J', 'K', 'M', 'N', 'O', 'P'}. A value mapping between storage states and data values can be generated following the principle discussed in relation to FIG. 20. Specifically, by ensuring that data value of the storage states for neighbouring entries in the demodulation mapping differ by at most 1 binary digit.

FIG. 24 shows part of a generalised demodulation mapping of three logical pages written over three quadruple level cells. FIG. 24 shows a generalised version of the mapping shown in FIG. 14. Since the memory cells are quadruple level cells there are 16 possible storage states and correspondingly there are 16 different write voltages. As a result each logical page stores 4/3 bits per cell and therefore each logical page (i.e. the first logical page, $P_0$, the second logical page, $P_1$, and the third logical page $P_2$) have 16 different storage states which are referred to as: {'A', 'B', 'C', 'D', 'E', 'F', 'G', 'H', 'I', 'J', 'K', 'L', 'M', 'N', 'O', 'P'}.

For simplicity, FIG. 24 only shows a demodulation mapping for a second and a third memory cell (i.e. $cell_{3i-1}$ and $cell_{3i}$) where the value of a first memory cell (i.e. $cell_{3i-2}$) is $v_e$ however demodulation mappings corresponding to other values for the first memory cell could be generated by replicating the decision boundaries used in FIG. 24 in the third dimension and assigning data values for each logical page based on a Gray coding.

Figure 25:
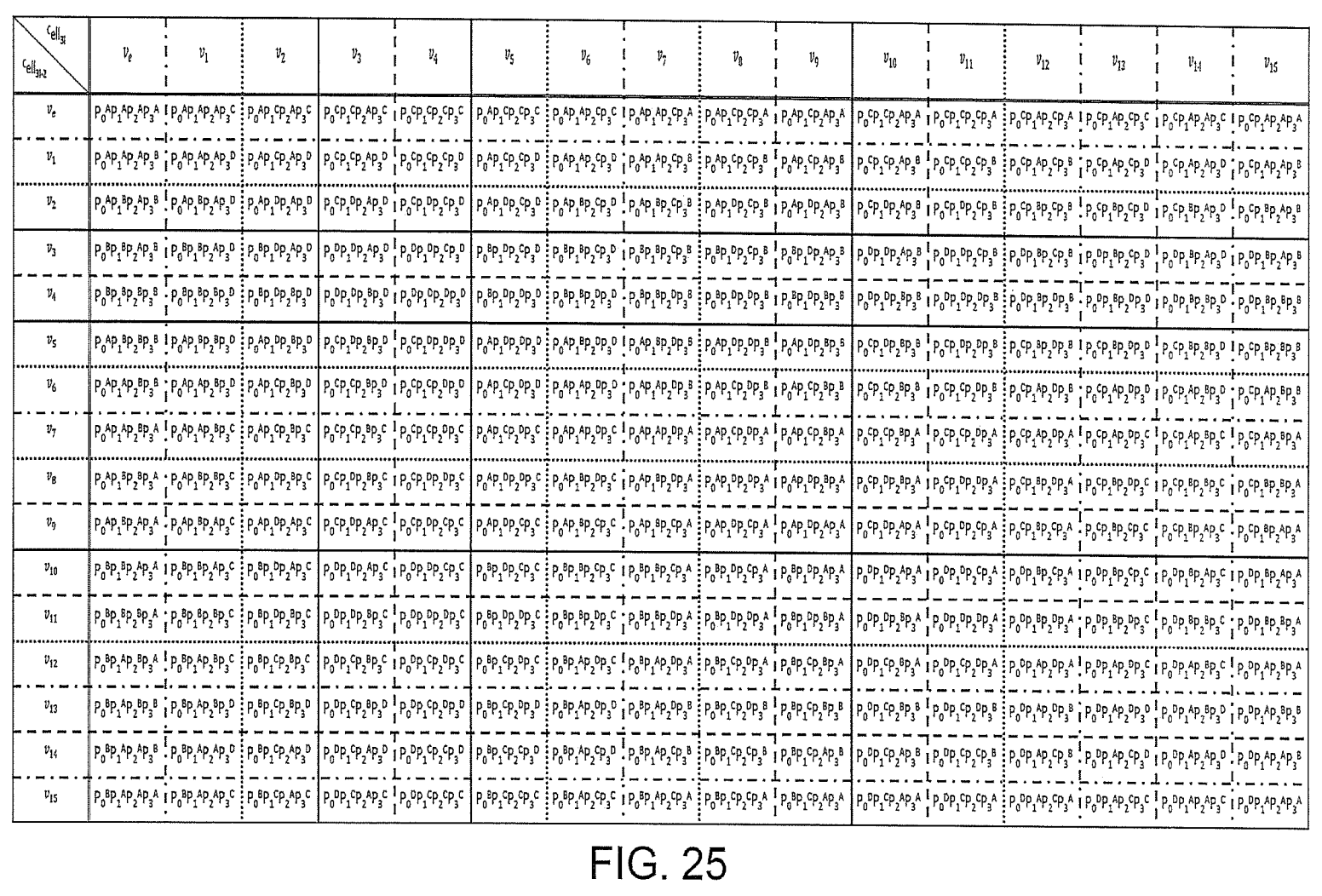

FIG. 25 shows a generalised demodulation mapping of four logical pages written over three quadruple level cells. FIG. 25 shows a generalised version of the mapping shown in FIG. 15. FIG. 25 shows a part of a demodulation mapping of four logical pages written over three quadruple level cells. Since the logical pages are mapped across three memory cells, the complete demodulation mapping is three dimensional. For simplicity, FIG. 25 only shows a demodulation mapping for a second and a third memory cell (i.e. $cell_{3i-1}$ and $cell_{3i}$) where the value of a first memory cell (i.e. $cell_{3i-2}$) is $v_e$ however demodulation mappings corresponding to other values for the first memory cell could be generated by replicating the decision boundaries present in FIG. 25 in the third dimension and assigning data values for each logical page in accordance with a Gray coding.

Since there are four logical pages and each memory cell (i.e. $cell_{3i}$, $cell_{3i-1}$ and $cell_{3i-2}$) is capable of storing 4 bits (i.e. 16 storage states); each logical page stores 1 bit/cell. Taken over three cells, each logical page stores 3 bits and correspondingly has 8 storage states, namely: {'A', 'B', 'C', 'D', 'E', 'F', 'G', 'H'}.

FIGS. 26A-H show a demodulation mapping of four logical pages written over three triple level cells. Since the logical pages are mapped across three memory cells, the complete demodulation mapping is three-dimensional. Each of FIGS. 26A-H show a two dimensional mapping for a given threshold voltage of the third memory cell (i.e. $cell_{3i}$)

In FIGS. 26A-H the individual table entries comprise: a first decimal number corresponding to the data value stored on the first logical page, a second decimal number corresponding to the data value stored on the second logical page, a third decimal number corresponding to the data value stored on the third logical page and a fourth decimal number corresponding to the data value stored on the fourth logical page.

Throughout FIGS. 26A-H a first set of decision boundaries used to determine the data value stored on the first logical page are shown in solid black lines, a second set of decision boundaries used to determine the data value stored on the second logical page are marked with fine dashed lines (or dots, as, for example, used between $v_e$ and $v_1$), a third set of decision boundaries which are used to determine the data value stored on the third logical page are marked with thick dashed lines (or dashes, as, for example, used between $v_1$ and $v_2$) and a fourth set of decision boundaries which are used to determine the data value stored on the fourth logical page are marked with lines comprising dots and dashes (as, for example, used between $v_2$ and $v_3$).

As discussed above, mapping data over blocks of cells rather than on a cell-by-cell basis can lead to: additional flexibility in assigning logical pages, a reduction in the disparity between the reading time of the different logical pages, superior BER performance and better estimation of stored data value by leveraging the inherent correlation between adjacent cells. Furthermore, unlike a cell-by-cell storage scheme, when modulating a logical page over multiple cells, different bits in the same logical page can have different reliabilities. This can be exploited by careful design of an irregular LDPC codes to provide more protection to the vulnerable bits.

In the previous examples (e.g. FIG. 8), mapping two logical pages over two Triple Level Cells (TLC) results in 7/2, or 3.5, reads per logical page, per memory cell in order to determine the data value stored on a logical page. Likewise, where three logical pages are mapped over two Triple Level Cells (TLC) the number of reads, per logical page, per memory cell is 7/3, or 2.34. This figure is the same as the number of reads required to determine a 3 bit data value stored in a flash memory cell (across three logical pages) when using Binary Reflective Grey Labelling (BRGL).

FIGS. 26A-H show an example of a mapping where the number of reads required to determine the data value stored on each logical page is less than Binary reflective Grey Labelling (BRGL). More specifically, FIGS. 26A-H show a mapping where four logical pages are mapped across three adjacent Triple Level Cells (TLC). In this example, each logical page stores 2 bits of information. Since the logical pages are mapped over three adjacent triple level cells, each logical page stores 2/3 bits per cell.

Modulating data over multiple cells enables a mapping to obtain an average reading time, or a number of reads per logical page, which is better than Binary Reflective Grey Labelling (BRGL). For example, in FIGS. 26A-H, 4 logical pages are mapped over three Triple level memory cells (each with 7 decision boundaries). Consequently, the average reading time is reduced to 7/4 or 1.75 reads per logical page per memory cell. This represents a substantial decrease in the average reading time compared to Binary Reflective Grey Labelling (BRGL).

Increasing the number of logical pages stored across the plurality of adjacent cells reduces the average reading time, or the average number of reads per logical page per memory cell in order to determine the stored data value. Depending on the number of logical pages selected, this may result in loss of storage efficiency.

For example, in the mapping of FIG. 8 data is mapped over two Triple Level Cells (TLC) (i.e. each having 8 storage states). As a result, there are 8×8, or 64, possible entries in the modulation/demodulation mapping. If two logical pages are used, and each logical page stores 3 bits of data, the number of possible entries in the demodulation/modulation mapping is used completely by the number of possible combinations of data values (i.e. with 3 bits of data there are 2^3=8 possible data values for each logical page. There are two logical pages therefore there are 8^2 or 64 possible combinations of the data values on the first and second page). In this case the mapping is 100% efficient because each of the possible entries represent a unique combination of data values.

In FIGS. 26A-H three adjacent triple level cells have 8×8×8=512 entries in the mapping. In order to reduce the average reading time (otherwise known as the average number of reads required per logical page per memory cell) to a value less than achieved using BRGL it is necessary to increase the number of logical pages beyond three. 512 unique entries can represent 9 bits of data. 9 bits of data, split between four logical pages results in the mapping being able to support 2.25 bits per logical page.

Since each page can only support an integer number of bits it is evident that, in this instance, the full capacity of the mapping is unused. For example, where each logical page stores 2 bits, the total number of data bits stored in the mapping across each logical page is 4×2=8. This results in a storage efficiency of 8/9 or 89%. Or, in other words, the rate loss is ⅑ bits per cell.

As shown in FIGS. 26A-H, when the number of entries in the modulation/demodulation mapping is greater than the number of possible data value combinations the table can contain multiple entries associated with the same combination of data values. For example, the data value "0220" is associated with the storage states: $cell_{3i}=v_e$, $cell_{3i-1}=v_2$ and $cell_{3i-2}=v_e$ (Shown in FIG. 26A) as well as $cell_{3i}=v_1$, $cell_{3i-1}=v_2$ and $cell_{3i-2}=v_1$. This repetition introduces redundancy into the mapping and reduces the storage efficiency.

FIGS. 27A-H show a demodulation mapping of four logical pages written over three triple level cells where duplicate entries are removed. FIGS. 27 A-H show similar mappings to FIGS. 26 A-H however unlike those mappings, duplicate entries are removed such that each possible combination of data values is only associated with one combination of storage states.

The mappings shown in FIGS. 26 and 27 demonstrate the trade-off that exists between the average reading time and the storage loss, namely decreasing the average reading time introduces an inherent capacity loss. That being said by carefully choosing the 3D constellation points a shaping gain can be achieved and an improved performance is expected as some of the errors can be more easily detected or correct.

In summary, modulating data across multiple cells using the mappings and the techniques for generating mappings discussed herein provides: flexibility in designing logical pages since the modulation and demodulation mappings can be changed at any time, superior performance by harnessing the correlation between the residual inter-cell-interference experienced by adjacent cells and achieves good performance using blocks of moderate length (i.e. two or three adjacent cells) without any capacity loss.

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A method of storing a number of data values in a plurality of flash memory cells wherein each flash memory cell has a plurality of storage states and each data value is selected from a set of possible data values, the method comprising:
   programming the number of data values to the plurality of flash memory cells using a mapping which uniquely associates each combination of storage states for the plurality of flash memory cells with a concatenated data value from a set of concatenated data values wherein:
   the set of concatenated data values comprises a concatenated data value for every combination of possible data values for the number of data values;
   the concatenated data value has a position for each data value in the number of data values; and
   the mapping is such that:
      between adjacent storage states all but one data values are identical; and
      each position in the concatenated data value changes the data value it represents between the same storage states on each flash memory cell.

2. A method according to claim 1 wherein a number of concatenated data values in the set of concatenated data values equals the number of combinations of storage states for the plurality of flash memory cells.

3. A method according to claim 2 wherein, for a given flash memory cell, the number of times a position in the concatenated data value changes the data value it represents differs by at most 1 from the number of times any other position in the concatenated data value changes the data value it represents.

4. A method according to claim 3 wherein the data value represented by a position of the concatenated data value differs between adjacent storage states by at most one binary digit in a binary representation.

5. The method of claim 1, further comprising:
   determining, for each memory cell, which group of storage states each memory cell has been programmed to by reading the memory cell, wherein a group of storage states within a memory cell is associated with fewer than all possible storage states;
   based on the mapping and on identified groups of storage states in all of the number of memory cells determining at least one data value from the concatenated data value; and
   outputting the determined data value.

6. The method of claim 1 wherein each flash memory cell has eight storage states, a number of memory cells equals two, the number of data values equals two.

7. The method of claim 1 wherein each flash memory cell has eight storage states, a number of memory cells equals two, the number of data values equals three.

8. The method of claim 1 wherein each flash memory cell has sixteen storage states, a number of memory cells equals two, the number of data values equals two.

9. The method of claim 1 wherein each flash memory cell has sixteen storage states, a number of memory cells equals three, the number of data values equals three.

10. A device for storing a number of data values in a plurality of flash memory cells wherein each flash memory cell has a plurality of storage states and each data value is selected from a set of possible data values, the device comprising a processor and a memory storing instruction for execution by the processor, the instructions causing the processor when executing the instructions to:
    program the number of data values to the plurality of flash memory cells using a mapping which uniquely associates each combination of storage states for the plurality of flash memory cells with a concatenated data value from a set of concatenated data values wherein:
    the set of concatenated data values comprises a concatenated data value for every combination of possible data values for the number of data values;
    the concatenated data value has a position for each data value in the number of data values; and
    the mapping is such that:
       between adjacent storage states all but one data values are identical; and
       each position in the concatenated data value changes the data value it represents between the same storage states on each flash memory cell.

11. The device according to claim 10, wherein a number of concatenated data values in the set of concatenated data values equals the number of combinations of storage states for the plurality of flash memory cells.

12. The device according to claim 11 wherein, for a given flash memory cell, the number of times a position in the concatenated data value changes the data value it represents differs by at most 1 from the number of times any other position in the concatenated data value changes the data value it represents.

13. The device according to claim 12 wherein the data value represented by a position of the concatenated data value differs between adjacent storage states by at most one binary digit in a binary representation.

14. The device according to claim 10, wherein the instructions further cause the processor to:
    determine, for each memory cell, which group of storage states each memory cell has been programmed to by reading the memory cell, wherein a group of storage states within a memory cell is associated with fewer than all possible storage states;
    based on the mapping and on identified groups of storage states in all of the number of memory cells determine at least one data value from the concatenated data value; and
    output the determined data value.

15. The device according to claim 10 wherein each flash memory cell memory cell has eight storage states, a number of memory cells equals two, the number of data values equals two.

16. The device according to claim 10 wherein each flash memory cell has eight storage states, a number of memory cells equals two, the number of data values equals three.

17. The device according to claim 10 wherein each flash memory cell has sixteen storage states, a number of memory cells equals two, the number of data values equals two.

18. The device according to claim 10 wherein each flash memory cell has sixteen storage states, a number of memory cells equals three, the number of data values equals three.

19. A flash memory comprising a plurality of flash memory cells and the device for storing a number of data values in a plurality of flash memory cells as claimed in claim 10, the flash memory being configured to store data in the plurality of flash memory cells using the device.

* * * * *